(12) United States Patent
Yeong et al.

(10) Patent No.: US 11,626,504 B2
(45) Date of Patent: Apr. 11, 2023

(54) FIN FIELD EFFECT TRANSISTOR (FINFET) DEVICE STRUCTURE

(71) Applicant: Taiwan Semiconductor Manufacturing Company, Ltd., Hsinchu (TW)

(72) Inventors: Sai-Hooi Yeong, Zhubei (TW); Chi-On Chui, Hsinchu (TW); Bo-Feng Young, Taipei (TW); Bo-Yu Lai, Taipei (TW); Kuan-Lun Cheng, Hsin-Chu (TW); Chih-Hao Wang, Baoshan Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 49 days.

(21) Appl. No.: 17/084,033

(22) Filed: Oct. 29, 2020

(65) Prior Publication Data
US 2021/0043751 A1    Feb. 11, 2021

Related U.S. Application Data

(62) Division of application No. 16/258,408, filed on Jan. 25, 2019, now Pat. No. 10,833,167.

(60) Provisional application No. 62/751,049, filed on Oct. 26, 2018.

(51) Int. Cl.
*H01L 29/66* (2006.01)
*H01L 29/08* (2006.01)

(52) U.S. Cl.
CPC ...... *H01L 29/6653* (2013.01); *H01L 29/0847* (2013.01); *H01L 29/66545* (2013.01); *H01L 29/66795* (2013.01)

(58) Field of Classification Search
CPC ... H01L 29/7855–7856; H01L 29/0843–0891; H01L 29/66636–66643; H01L 29/66575–66598; H01L 29/66515; H01L 29/66659; H01L 29/7835; H01L 29/78624; H01L 29/41791; H01L 2029/7858; H01L 21/823418–823425; H01L 21/823814; H01L 21/823431; H01L 21/823821; H01L 21/845; H01L 27/0886; H01L 27/0924; H01L 27/10826; H01L 27/10879; H01L 27/1211
See application file for complete search history.

(56) References Cited

U.S. PATENT DOCUMENTS

| | | |
|---|---|---|
| 8,836,016 B2 | 9/2014 | Wu et al. |
| 8,841,701 B2 | 9/2014 | Lin et al. |
| 8,847,293 B2 | 9/2014 | Lee et al. |

(Continued)

*Primary Examiner* — Victor A Mandala
*Assistant Examiner* — Lawrence C Tynes, Jr.
(74) *Attorney, Agent, or Firm* — Birch, Stewart, Kolasch & Birch, LLP

(57) ABSTRACT

A FinFET device structure is provided. The FinFET device structure includes a fin structure formed over a substrate, and a gate structure formed over the fin structure. The FinFET device structure also includes an epitaxial source/drain (S/D) structure formed over the fin structure. A top surface and a sidewall of the fin structure are surrounded by the epitaxial S/D structure. A first distance between an outer surface of the epitaxial S/D structure and the sidewall of the fin structure is no less than a second distance between the outer surface of the epitaxial S/D structure and the top surface of the fin structure.

20 Claims, 31 Drawing Sheets

(56) References Cited

U.S. PATENT DOCUMENTS

| | | |
|---|---|---|
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |
| 10,679,900 B2 | 6/2020 | Chiang et al. |
| 2014/0203370 A1* | 7/2014 | Maeda .............. H01L 29/66795 |
| | | 257/365 |
| 2017/0047411 A1* | 2/2017 | Cheng .................... H01L 29/24 |
| 2017/0084461 A1* | 3/2017 | Colinge ............ H01L 29/66553 |
| 2018/0130886 A1* | 5/2018 | Kim .................... H01L 29/0847 |
| 2018/0175170 A1* | 6/2018 | Tsai ................. H01L 29/66545 |

* cited by examiner

FIN FIELD EFFECT TRANSISTOR (FINFET) DEVICE STRUCTURE

CROSS REFERENCE TO RELATED APPLICATIONS

This Application is a divisional application of U.S. application Ser. No. 16/258,408, filed Jan. 25, 2019, now U.S. Pat. No. 10,833,167 B2, which claims the benefit of U.S. Provisional Application No. 62/751, 049 filed on Oct. 26, 2018, and entitled "Fin field effect transistor (FinFET) device structure and method for forming the same", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 4A-1, 4A-2 and 4B to 4E are cross-sectional representations of various stages of forming a modified FinFET device structure shown in FIGS. 3A to 3E, in accordance with some embodiments of the disclosure.

DETAILED DESCRIPTION

Figure 1A:
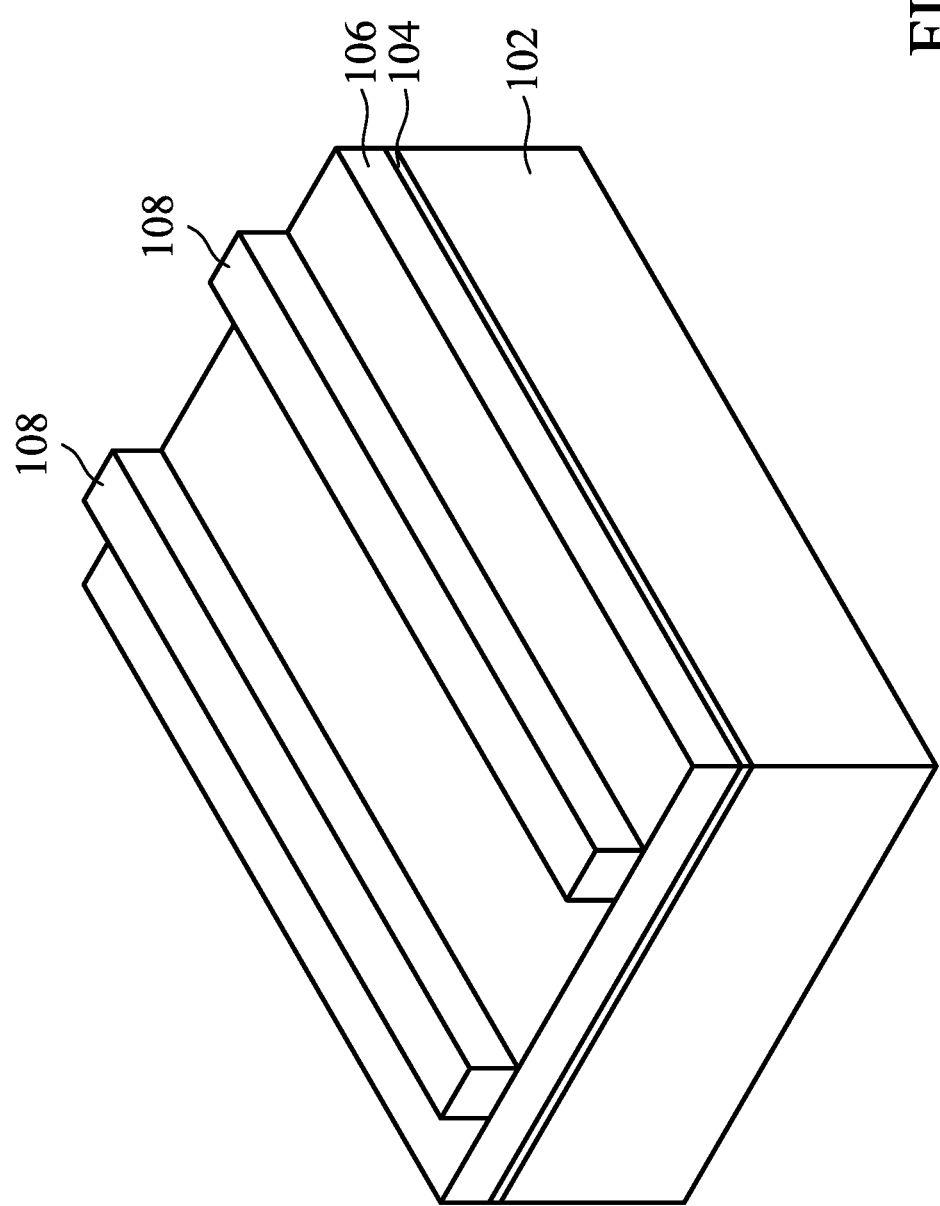
FIGS. 1A to 1N are perspective representations of various stages of forming a FinFET device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Fin structures described below may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what are otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

Embodiments of a fin field effect transistor (FinFET) device structure are provided in accordance with some embodiments of the disclosure. The FinFET device structure may include an epitaxial source/drain (S/D) structure formed over a fin structure, and a top surface and a sidewall of the fin structure may be surrounded by the epitaxial S/D structure. Therefore, the process window for growing the epitaxial S/D structures may be enlarged, and the epitaxial S/D structures may not easy to merge with each other, especially in applications having small fin pitches.

Figure 1B:
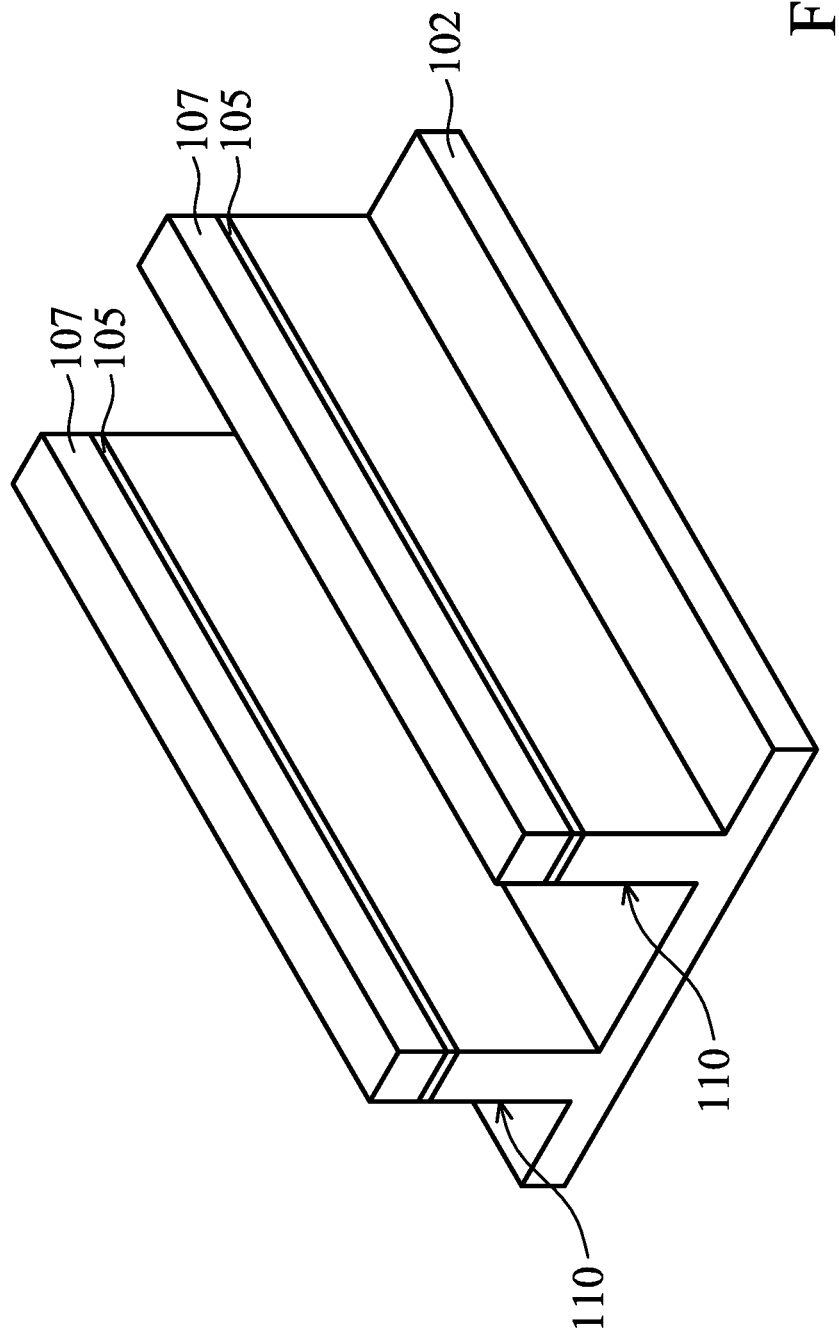
FIGS. 2A-1 to 2G-1, 2A-2 to 2G-2, 2H, 2I and 2J are cross-sectional representations of various stages of forming a FinFET device structure shown in FIGS. 1E to 1N, in accordance with some embodiments of the disclosure.
Figure 1C:
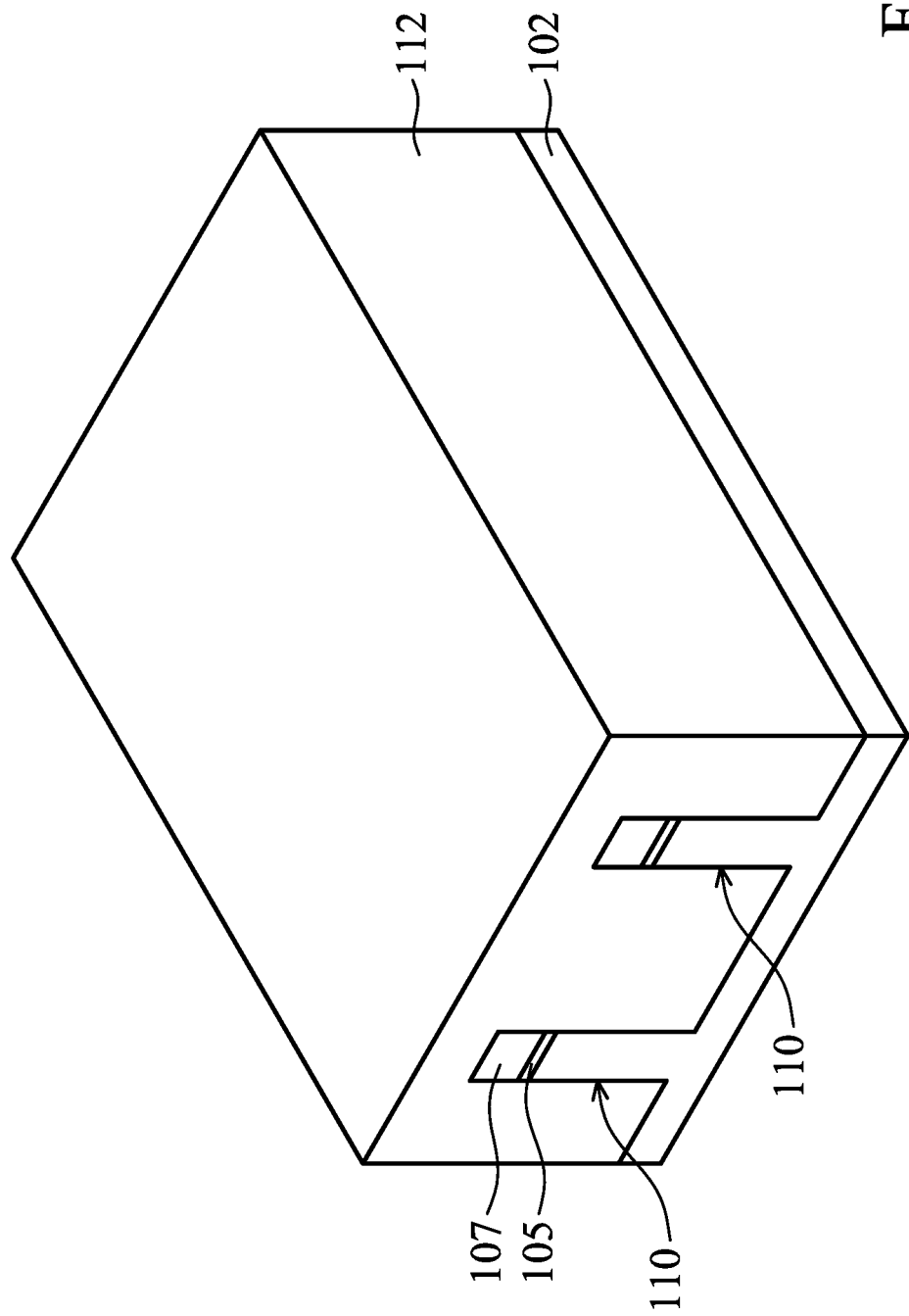
Figure 1D:
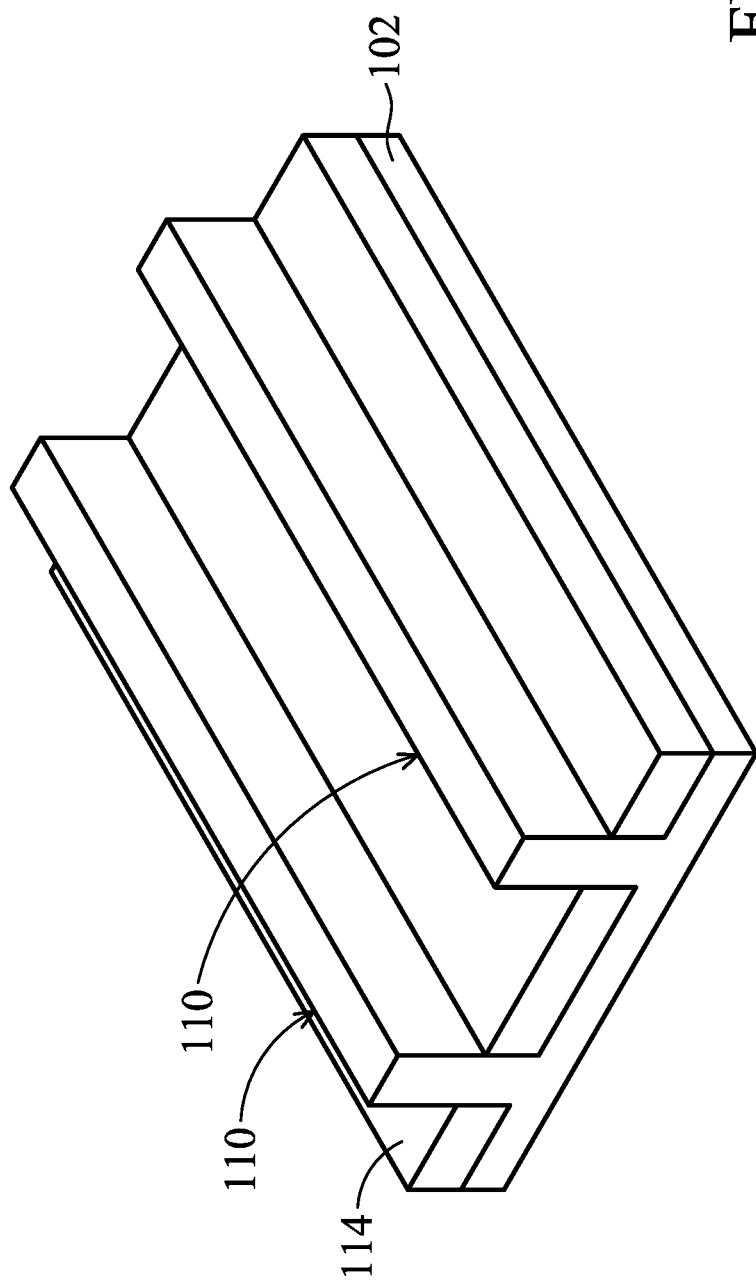
Figure 1E:
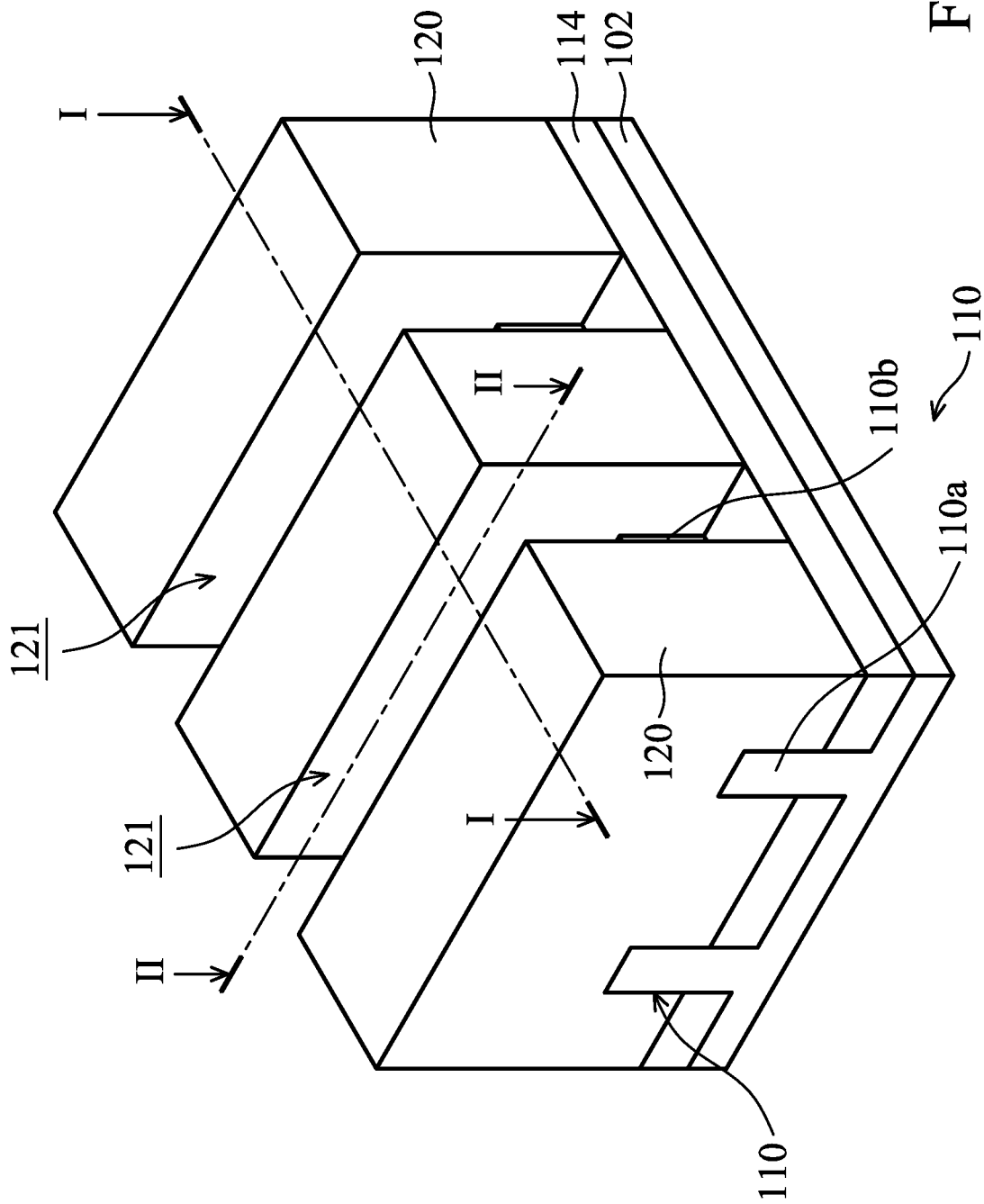
Figure 1F:
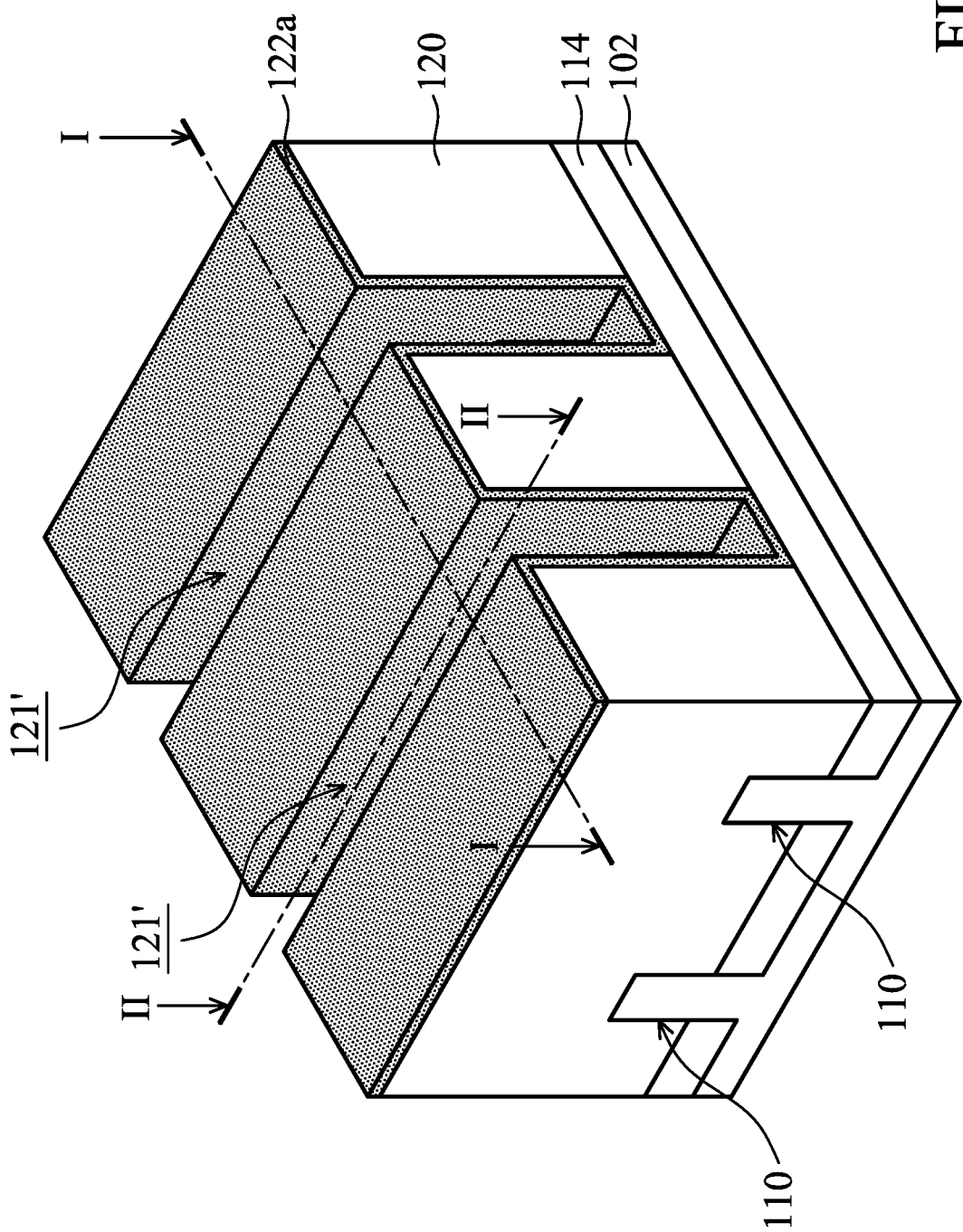
Figure 1G:
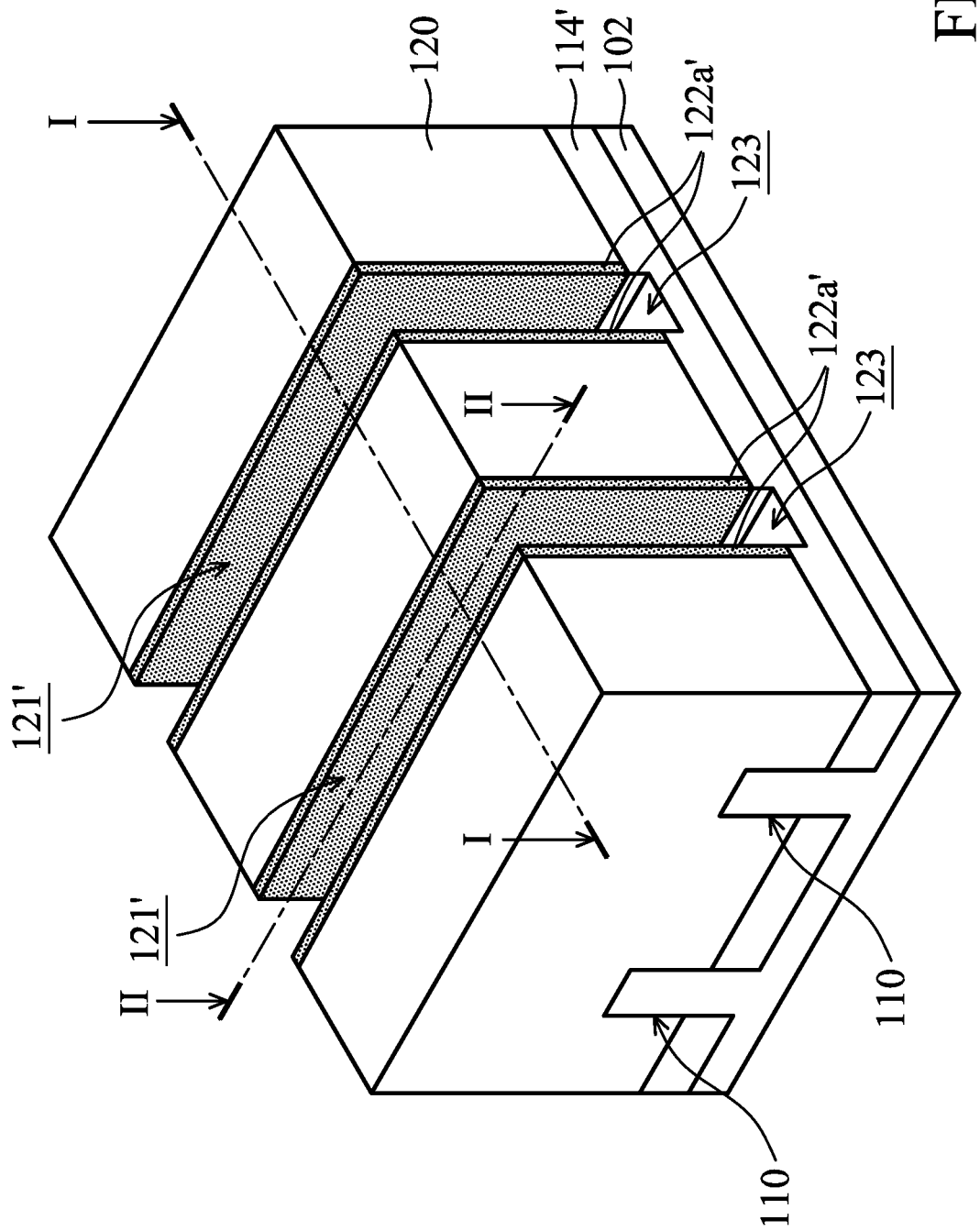
Figure 1H:
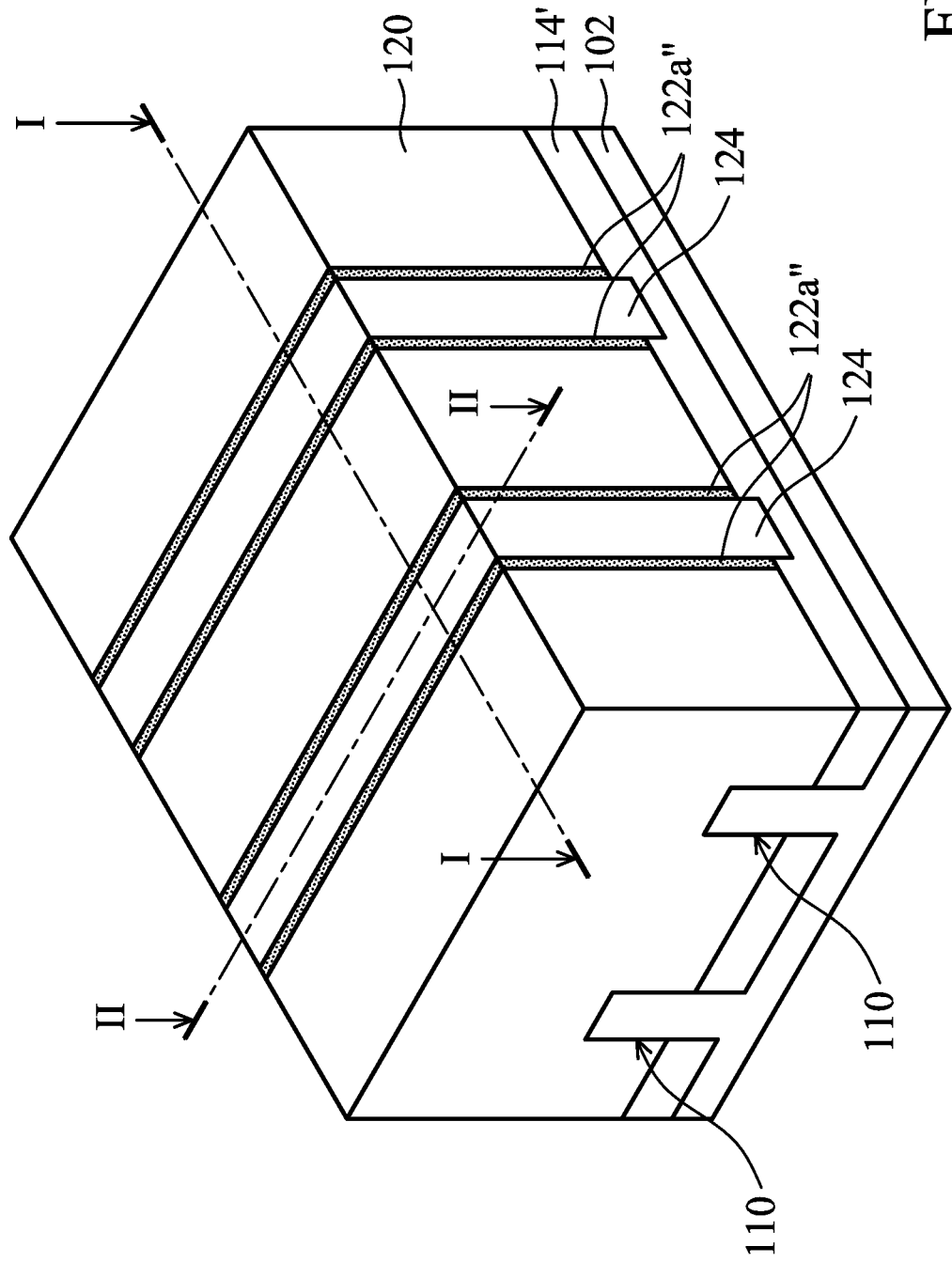
Figure 1I:
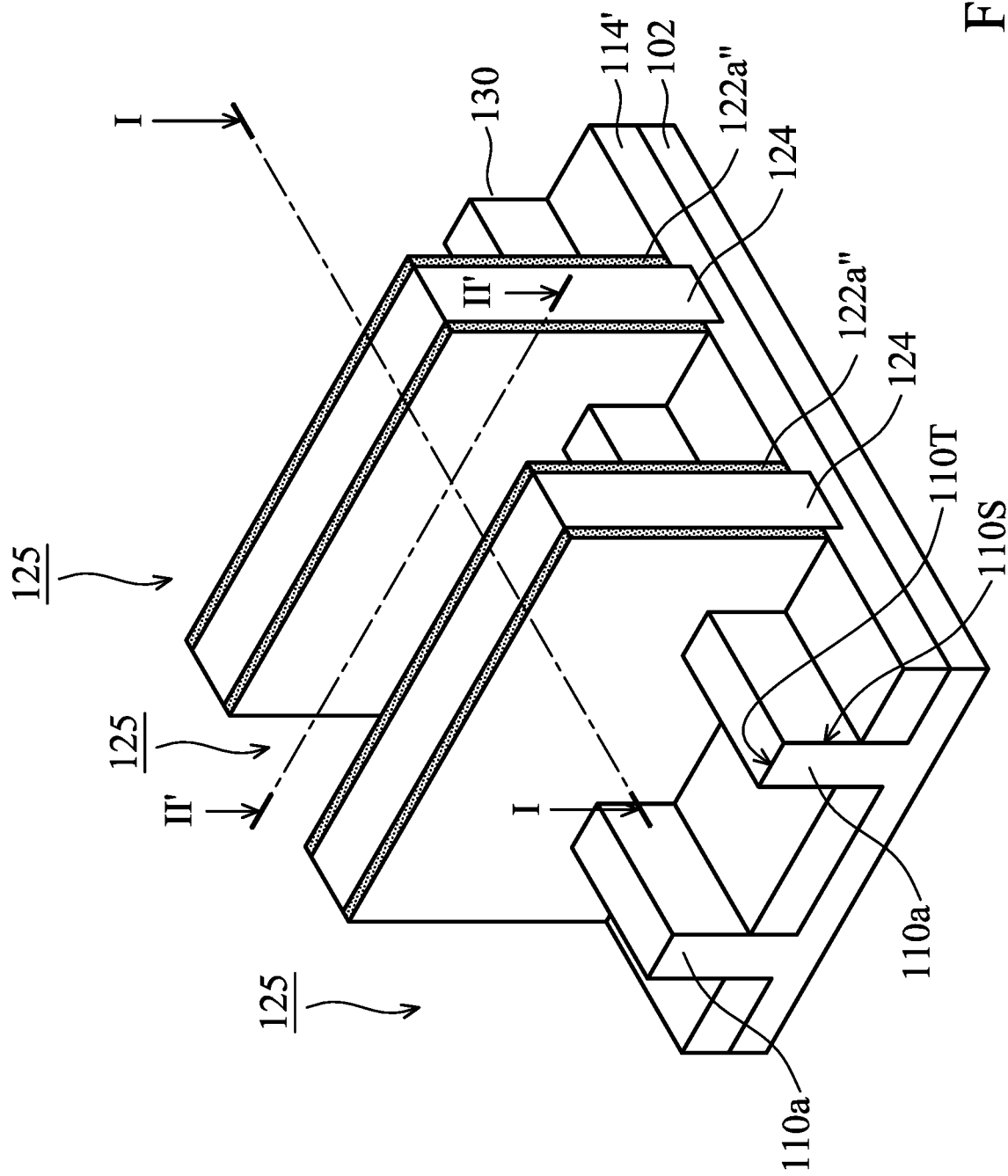
Figure 1J:
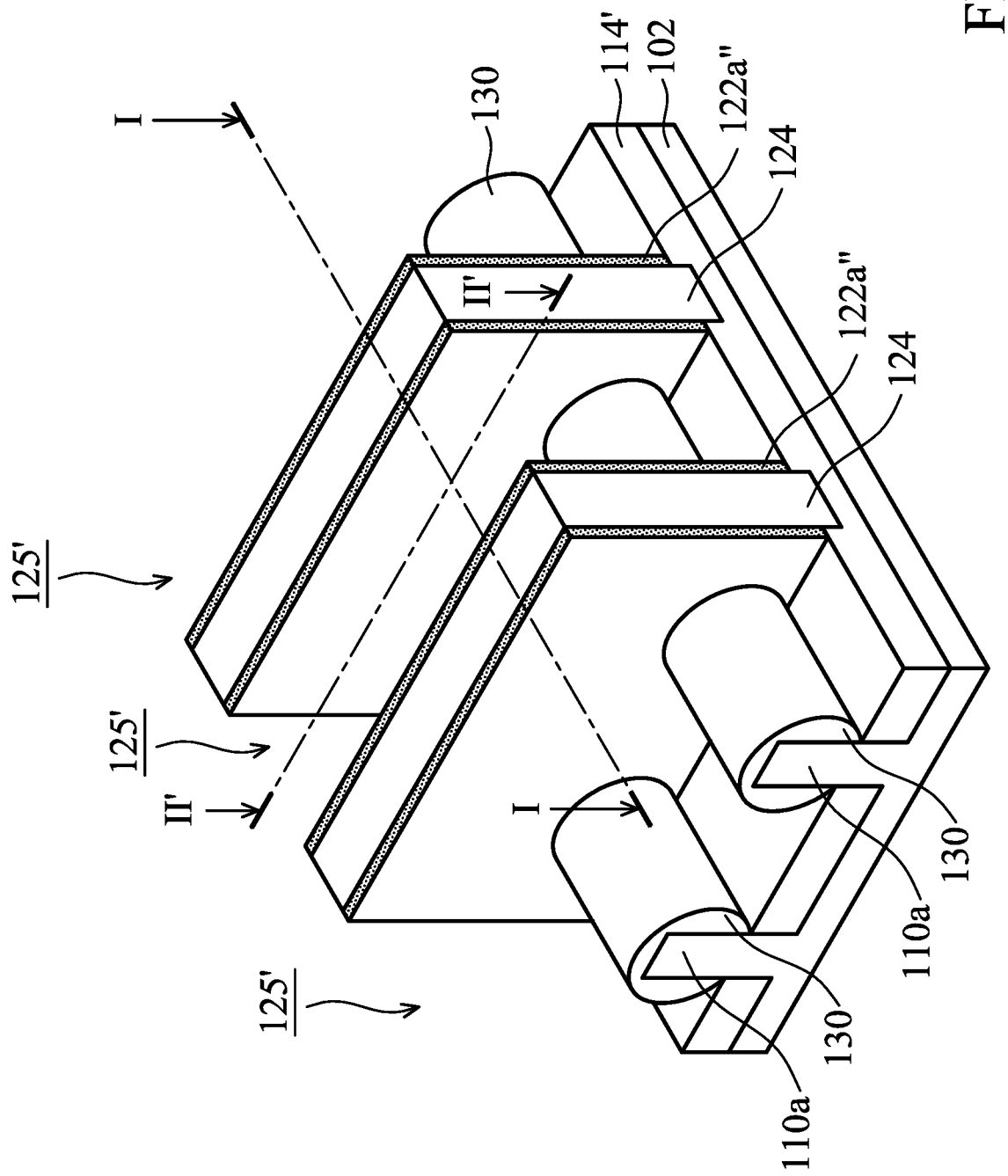
Figure 1K:
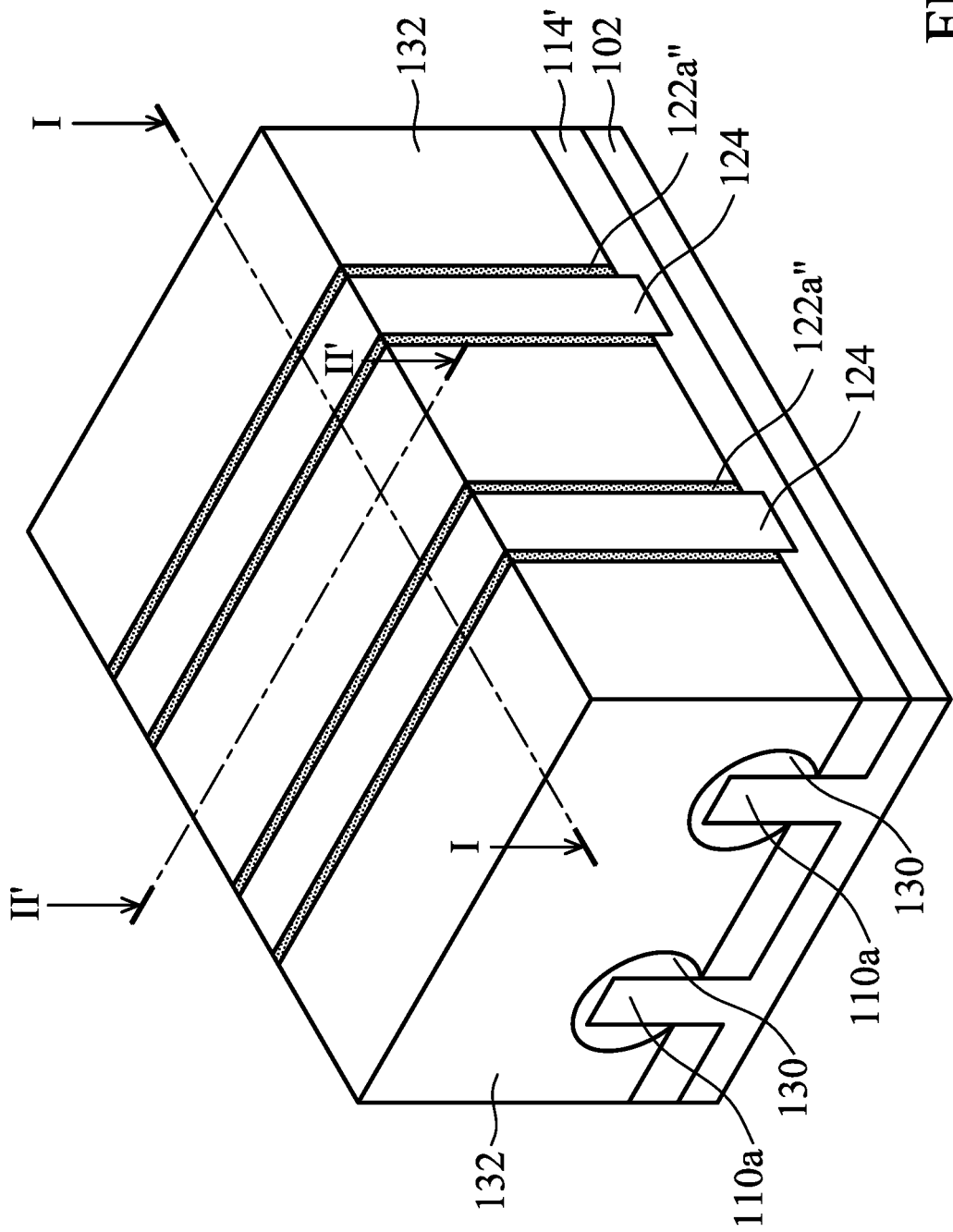
Figure 1L:
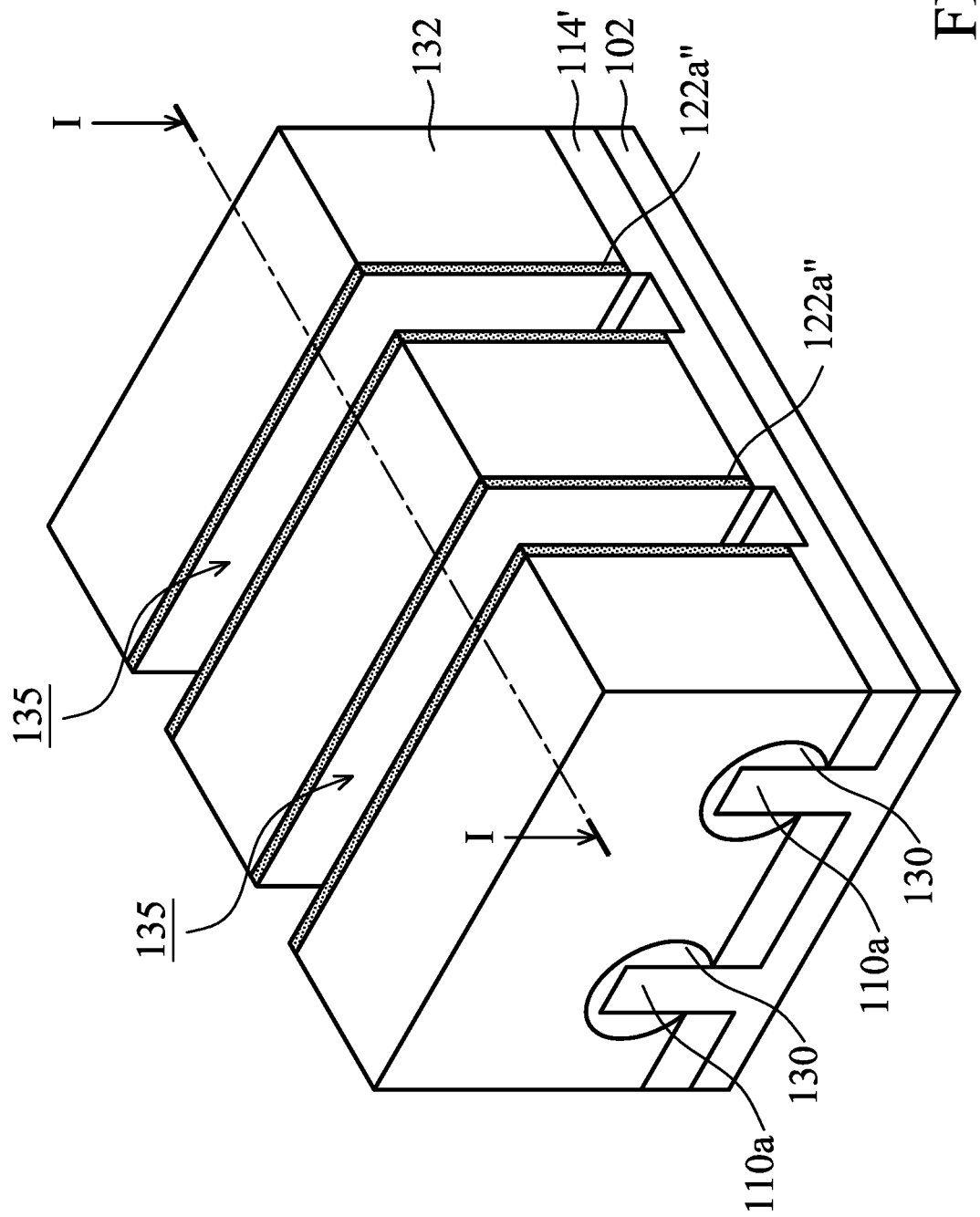
Figure 1M:
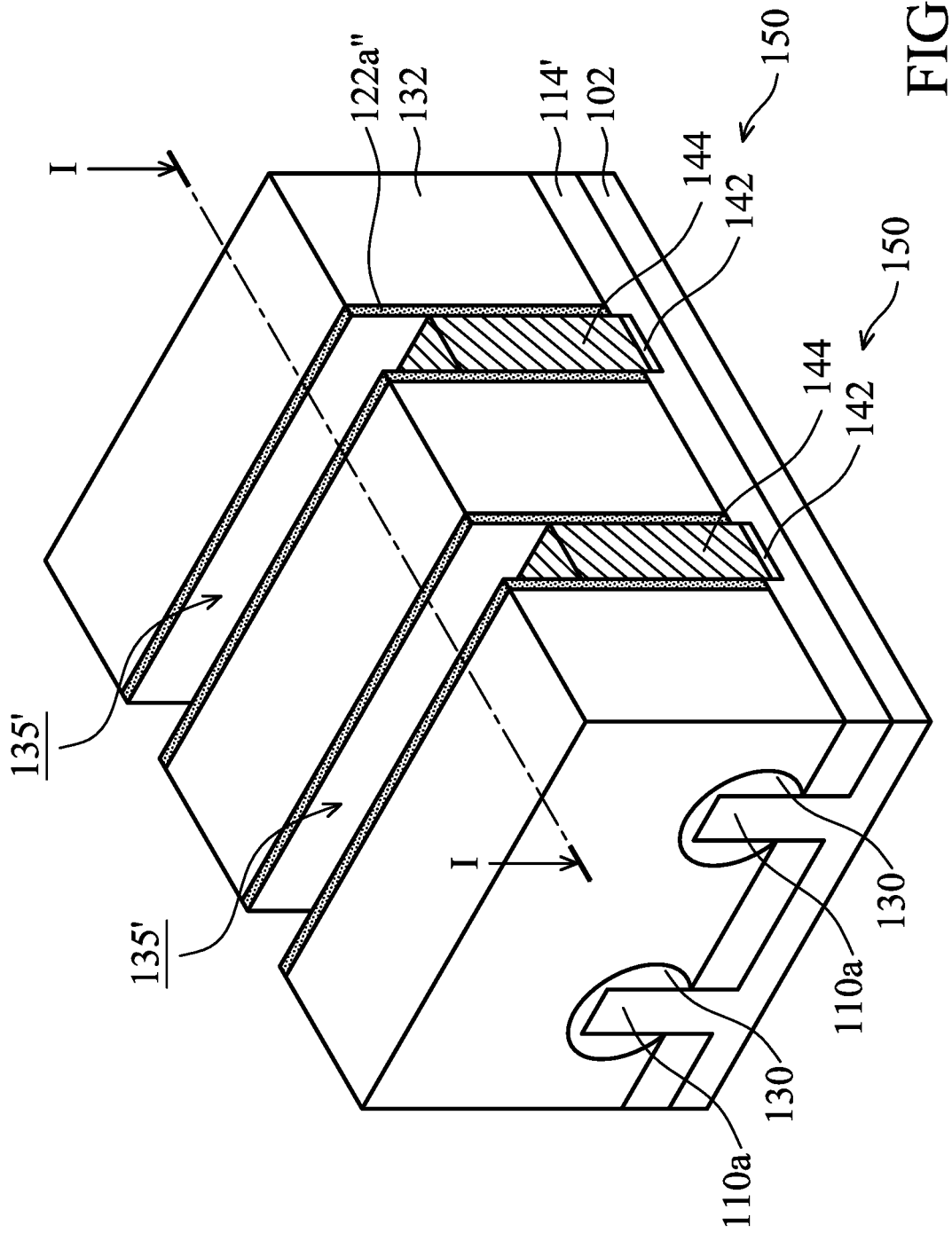
Figure 1N:
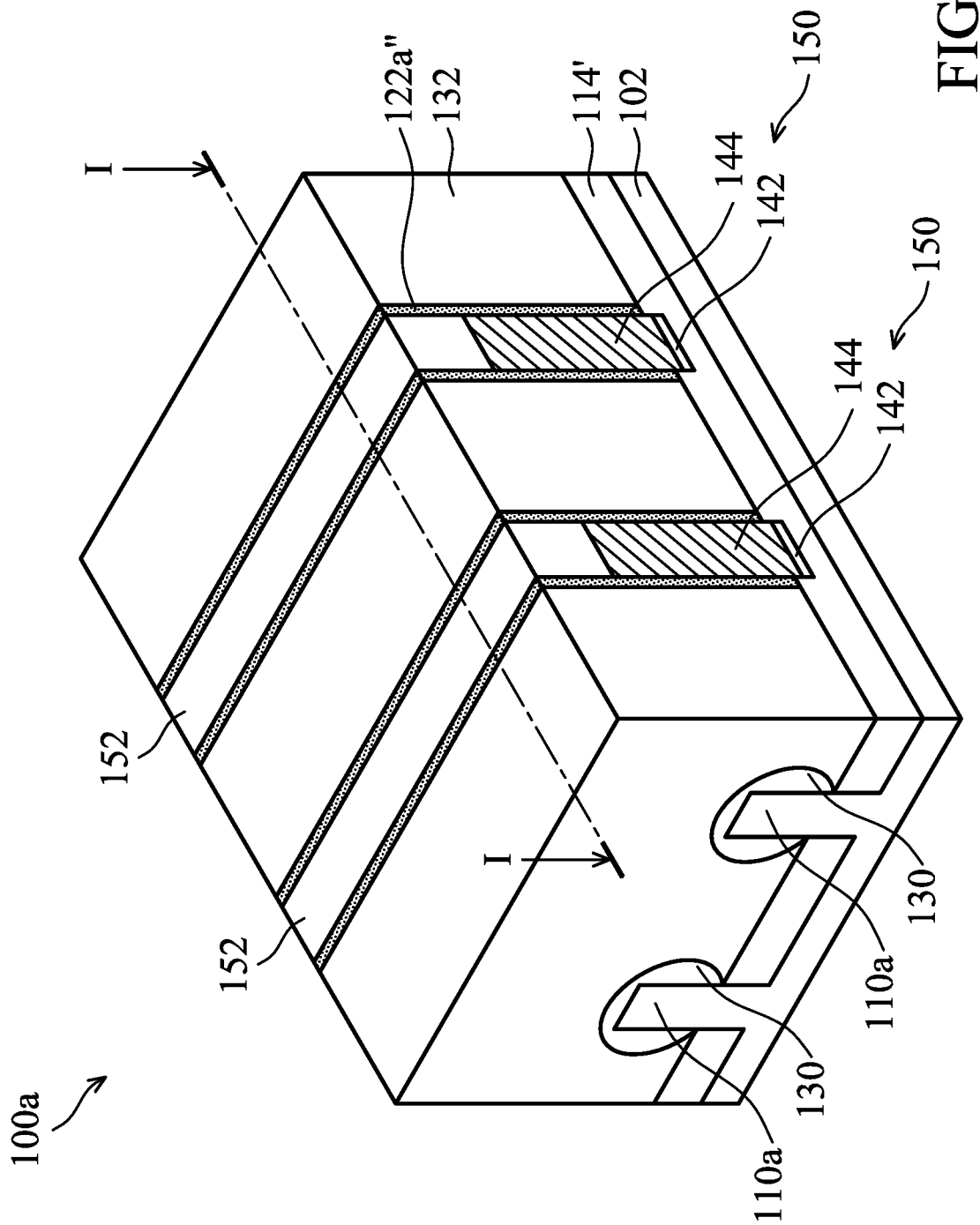

FIGS. 1A to 1N are perspective representations of various stages of forming a FinFET device structure 100a, in accordance with some embodiments of the disclosure. FIGS. 2A-1 to 2G-1, 2A-2 to 2G-2, 2H, 2I and 2J are cross-sectional representations of various stages of forming the FinFET device structure 100a shown in FIGS. 1E to 1N, in accordance with some embodiments of the disclosure.

Figures 1, 2A:
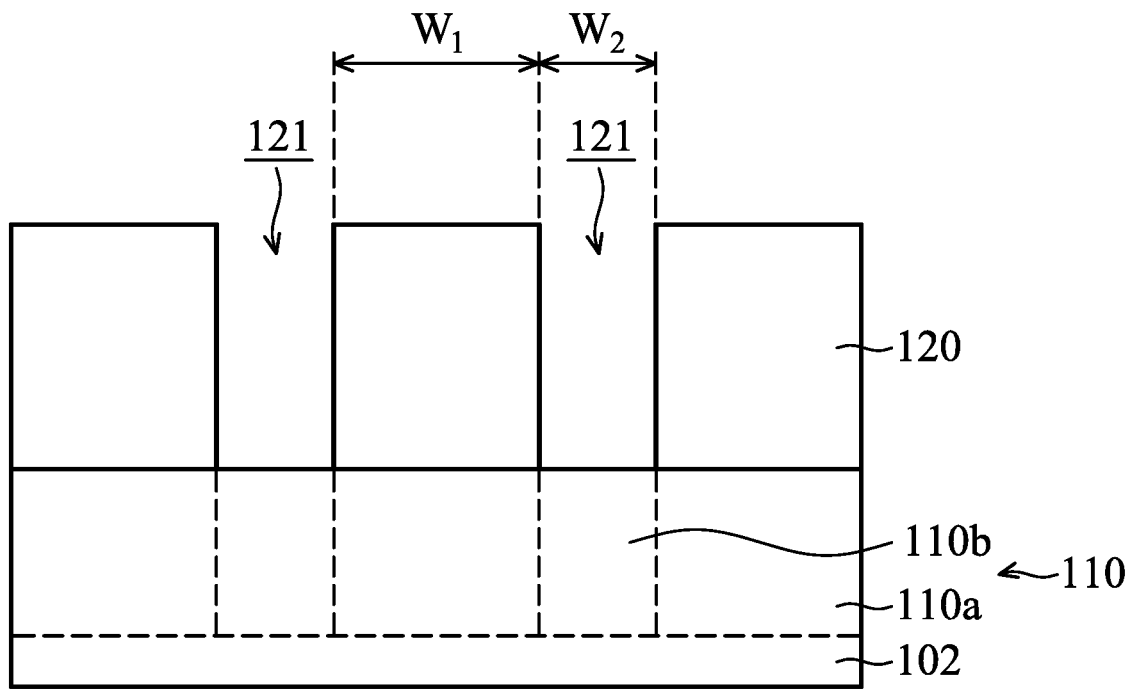
Figures 2, 2A:
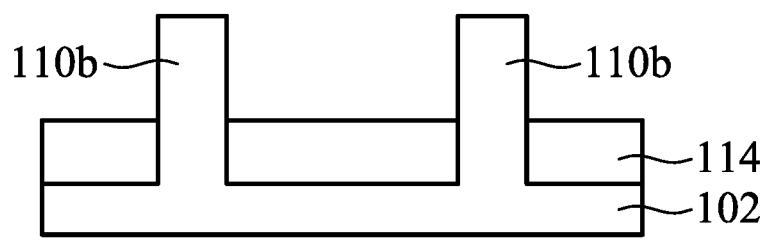
Figures 1, 2B:
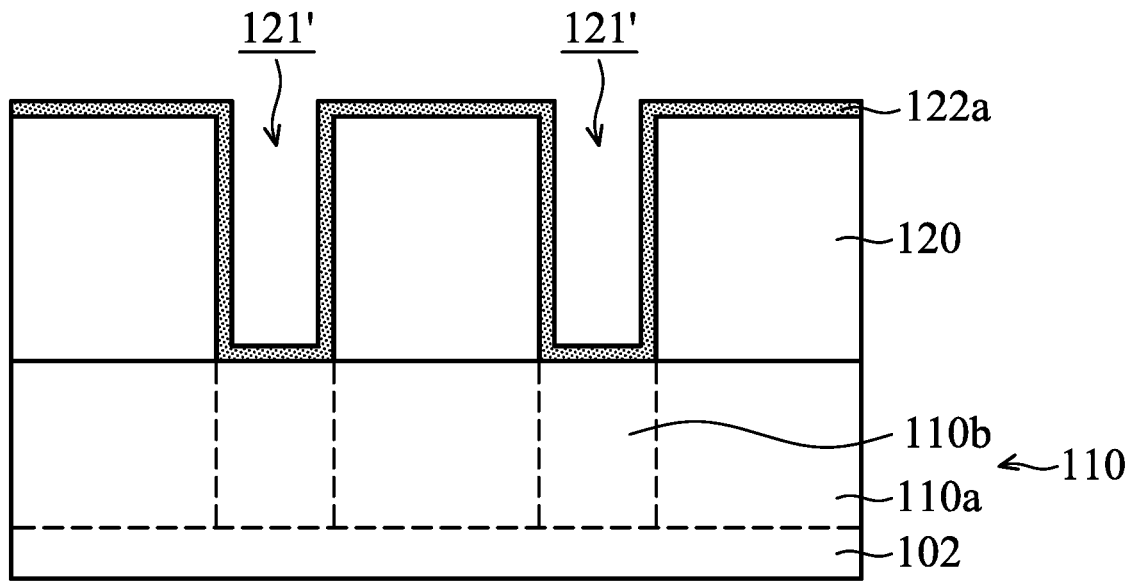
Figures 2, 2B:
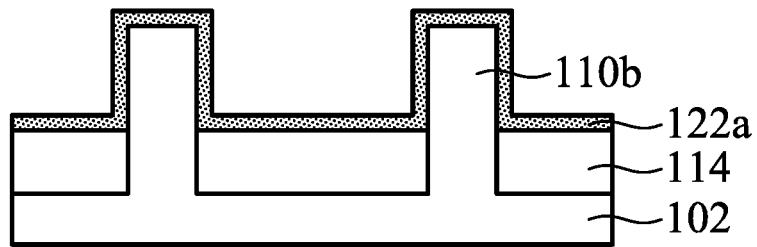
Figures 1, 2C:
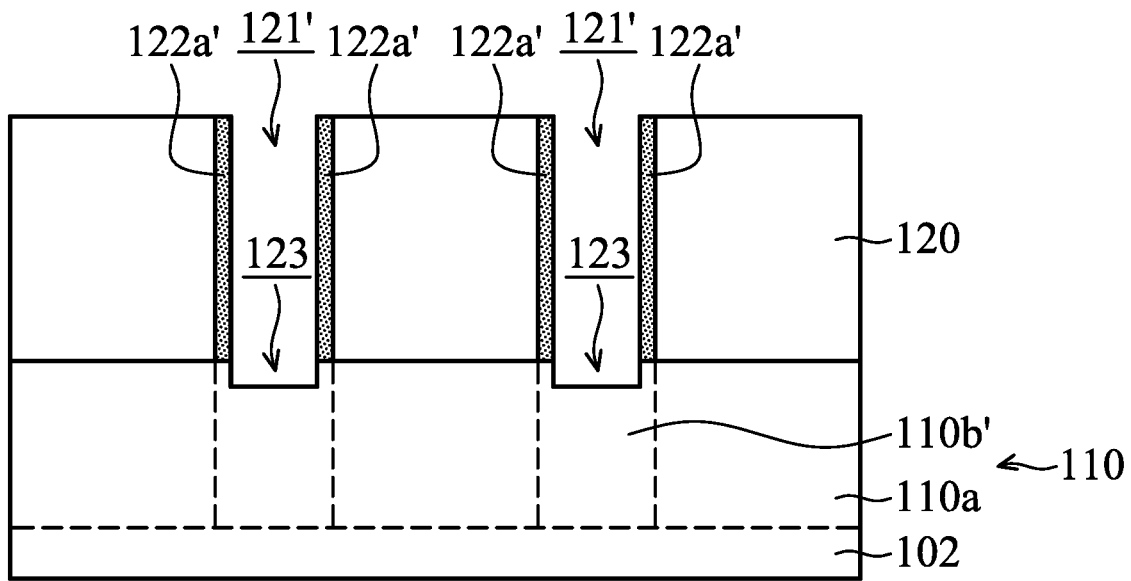
Figures 2, 2C:
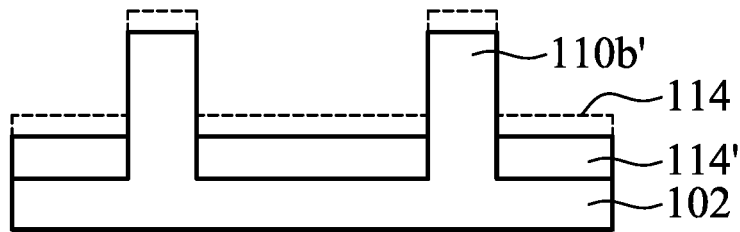
Figures 1, 2D:
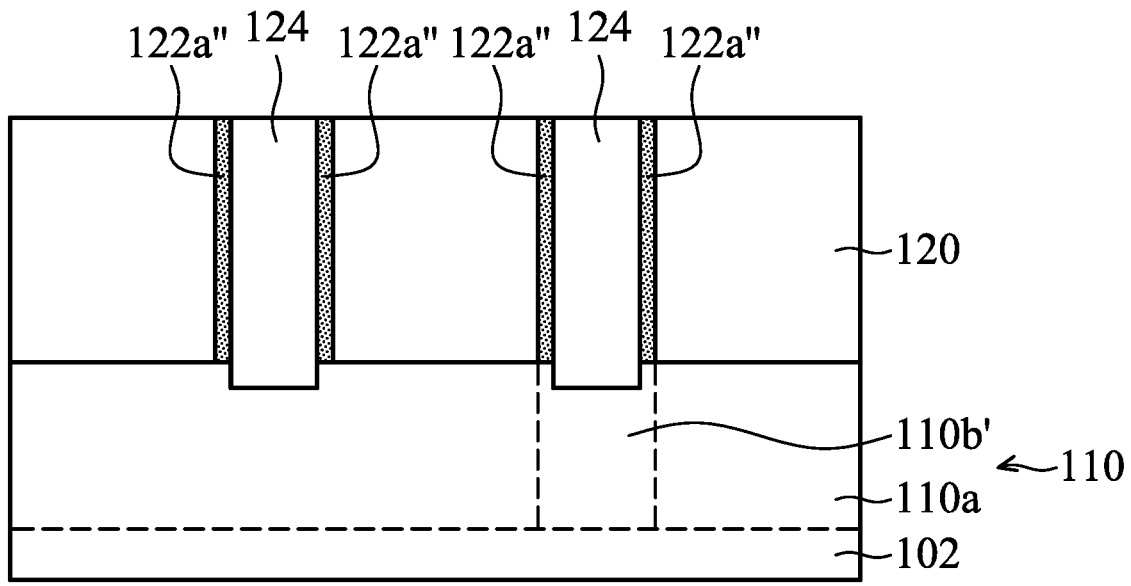
Figures 2, 2D:
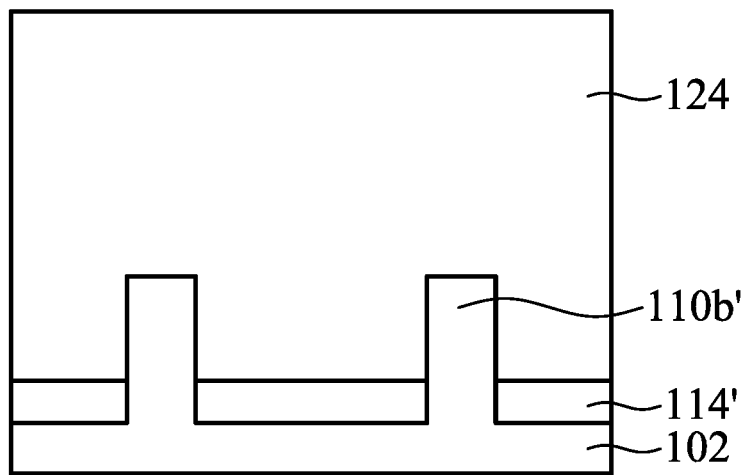
Figures 1, 2E:
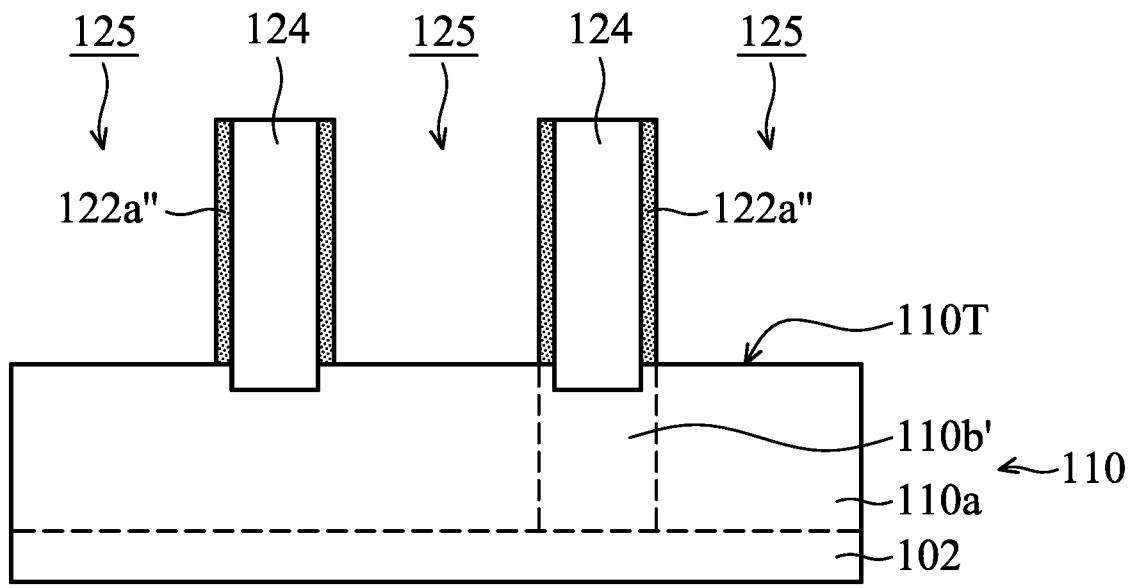
Figures 2, 2E:
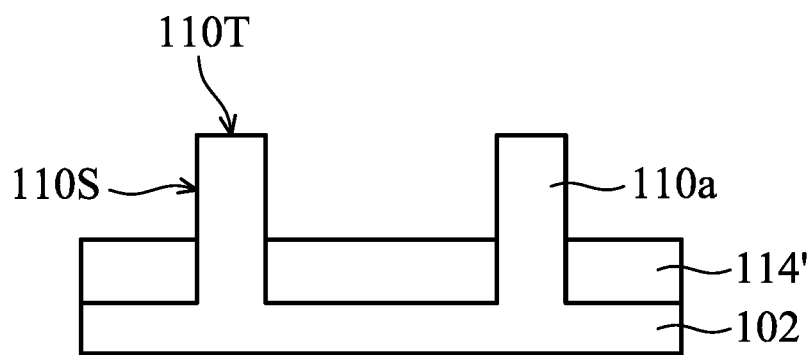
Figures 1, 2F:
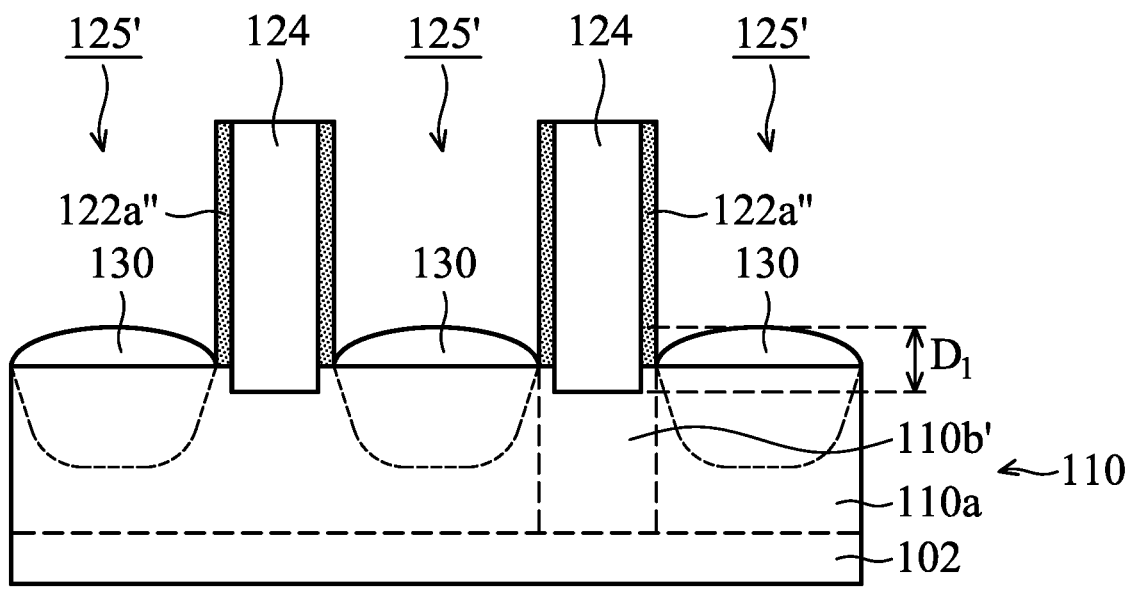
Figures 2, 2F:
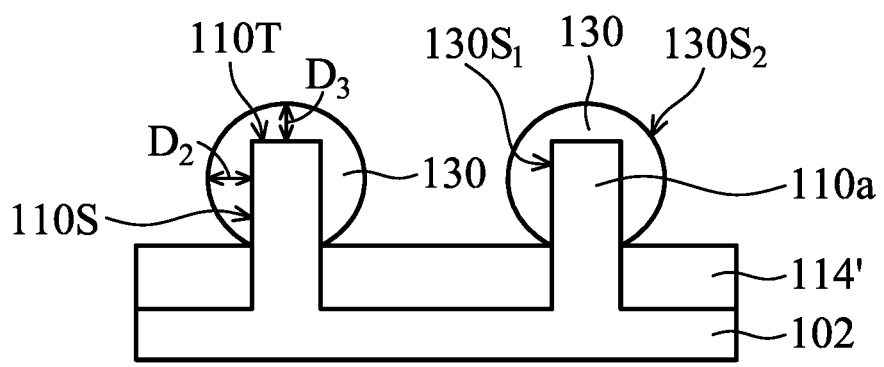
Figures 1, 2G:
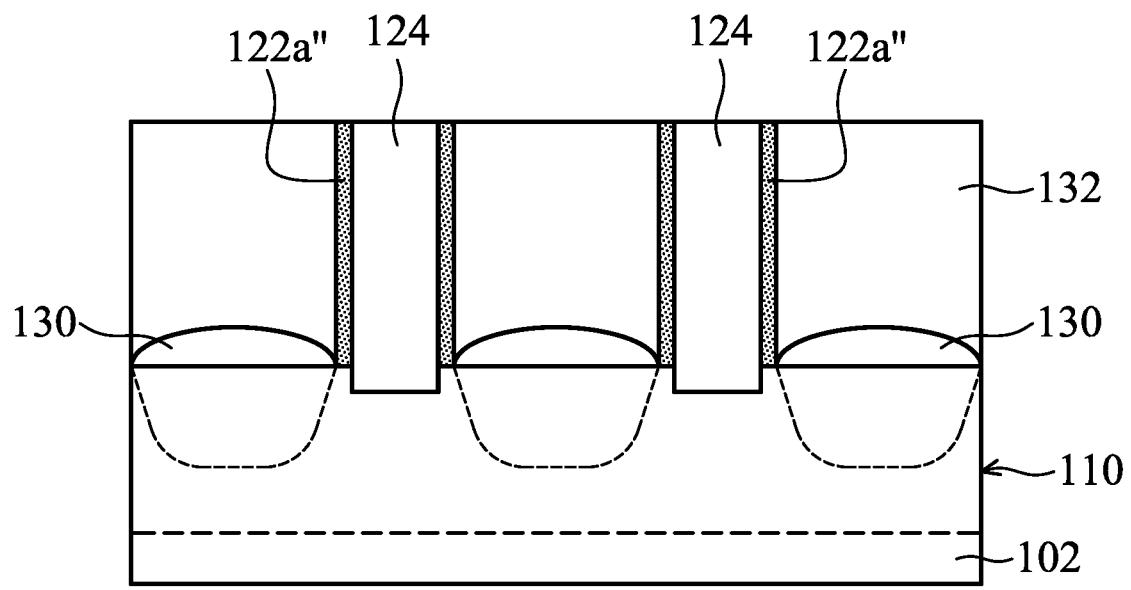
Figures 2, 2G:
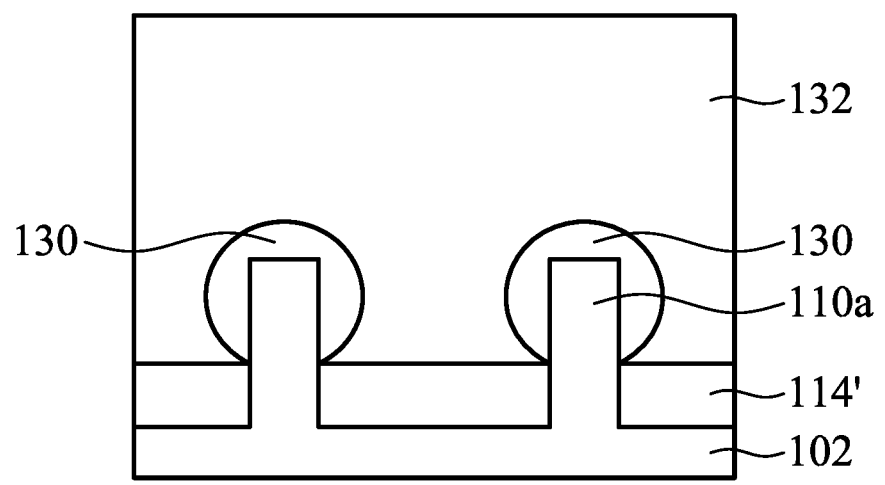

FIGS. 2A-1 to 2G-1, 2H, 2I and 2J are cross-sectional representations taken along line I-I of FIGS. 1E to 1N. FIGS. 2A-2 to 2D-2 are cross-sectional representations taken along line II-II of FIGS. 1E to 1H. FIGS. 2E-2 to 2G-2 are cross-sectional representations taken along line II'-II' of FIGS. 1I to 1K. It should be noted that the position of the line II-II is different from the position of the line II'-II'.

A substrate 102 is provided, as shown in FIG. 1A in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. In some embodiments, the substrate 102 includes an epitaxial layer. For example, the substrate 102 has an epitaxial layer overlying a bulk semiconductor.

Afterwards, a dielectric layer 104 and a mask layer 106 are formed over the substrate 102, and a patterned photoresist layer 108 is formed over the mask layer 106, as shown in FIG. 1A in accordance with some embodiments. The patterned photoresist layer 108 may be formed by a deposition process and a subsequent patterning process.

The deposition process for forming the patterned photoresist layer 108 may include a chemical vapor deposition (CVD) process, a high-density plasma chemical vapor deposition (HDPCVD) process, a spin-on process, a sputtering process, or another applicable process. The patterning process for forming the patterned photoresist layer 108 may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

Moreover, the dielectric layer 104 may be a buffer layer between the substrate 102 and the mask layer 106. In some embodiments, the dielectric layer 104 is used as a stop layer when the mask layer 106 is removed. The dielectric layer 104 may be made of silicon oxide. The mask layer 106 may be made of silicon oxide, silicon nitride, silicon oxynitride, or another applicable material. In some embodiments, more than one mask layer 106 is formed over the dielectric layer 104.

The dielectric layer 104 and the mask layer 106 may be formed by deposition processes, which may include a chemical vapor deposition (CVD) process, a high-density plasma chemical vapor deposition (HDPCVD) process, a spin-on process, a sputtering process, or another applicable process.

After the patterned photoresist layer 108 is formed, the dielectric layer 104 and the mask layer 106 are patterned by using the patterned photoresist layer 108 as a mask, as shown in FIG. 1B in accordance with some embodiments. As a result, a patterned dielectric layer 105 and a patterned mask layer 107 are obtained. Afterwards, the patterned photoresist layer 108 is removed.

Next, an etching process is performed on the substrate 102 to form fin structures 110 by using the patterned dielectric layer 105 and the patterned mask layer 107 as a mask. The etching process may be a dry etching process or a wet etching process.

In some embodiments, the substrate 102 is etched by a dry etching process. The dry etching process includes using a fluorine-based etchant gas, such as $SF_6$, $C_xF_y$, $NF_3$ or a combination thereof. The etching process may be a time-controlled process, and continue until the fin structures 110 reach a predetermined height. In some embodiments, the fin structures 110 have a width that gradually increases from the top portion to the lower portion.

After the fin structures 110 are formed, an insulating layer 112 is formed to cover the fin structures 110, the patterned dielectric layer 105, and the patterned mask layer 107 over the substrate 102, as shown in FIG. 1C in accordance with some embodiments. In some embodiments, the insulating layer 112 is made of silicon oxide, silicon nitride, silicon oxynitride, fluoride-doped silicate glass (FSG), or another low-k dielectric material. The insulating layer 112 may be deposited by a chemical vapor deposition (CVD) process, a spin-on-glass process, or another applicable process.

Next, the insulating layer 112 is thinned or planarized to expose the top surface of the patterned mask layer 107. In some embodiments, the insulating layer 112 is thinned by a chemical mechanical polishing (CMP) process. Afterwards, the patterned dielectric layer 105 and the patterned mask layer 107 are removed.

After the patterned dielectric layer 105 and the patterned mask layer 107 are removed, an upper portion of the insulating layer 112 is removed to form an isolation structure 114, as shown in FIG. 1D in accordance with some embodiments. The isolation structure 114 may be a shallow trench isolation (STI) structure surrounding the fin structures 110.

In some embodiments, portions of the fin structures 110 are embedded in the isolation structure 114. More specifically, a lower portion of each of the fin structures 110 is surrounded by the isolation structure 114, while an upper portion of each of the fin structures 110 protrudes from the isolation structure 114. The isolation structure 114 is configured to prevent electrical interference or crosstalk.

After the isolation structure 114 is formed, a polysilicon layer 120 is formed across the fin structures 110 and extends over the isolation structure 114, as shown in FIGS. 1E, 2A-1 and 2A-2 in accordance with some embodiments. In some embodiments, the polysilicon layer 120 is formed by a procedure including deposition, photolithography patterning, and etching processes.

More specifically, each of the fin structures 110 includes first portions 110a and second portions 110b. In some embodiments, the first portions 110a are covered by the polysilicon layer 120. In some embodiments, openings 121 are formed in the polysilicon layer 120, and the second portions 110b are exposed by the openings 121.

The polysilicon layer 120 may include a plurality of segments, each of the openings 121 may be defined between two adjacent segments of the polysilicon layer 120. Each of the segments of the polysilicon layer 120 has a width $W_1$, each of the openings 121 has a width $W_2$, and the width $W_1$ is greater than the width $W_2$, as shown in FIG. 2A-1 in accordance with some embodiments. In addition, the width $W_1$ is also the width of each of the first portions 110a, and the width $W_2$ is also the width of each of the second portions 110b.

After the polymer layer 120 is formed, a spacer material 122a is formed to conformally cover top surfaces and sidewalls of the polysilicon layer 120, top surfaces and sidewalls of the second portions 110b of the fin structures 110, and extend over the isolation structure 114, as shown in FIGS. 1F, 2B-1 and 2B-2 in accordance with some embodiments.

In some embodiments, the spacer material 122a is made of low-k dielectric materials. In some embodiments, the low-k dielectric materials have a dielectric constant (k value) less than about 4. Examples of low-k dielectric materials include, but are not limited to, silicon oxide, silicon nitride, silicon carbonitride (SiCN), silicon oxide carbonitride (SiOCN), fluorinated silica glass (FSG), carbon doped silicon oxide, amorphous fluorinated carbon, parylene, bis-benzocyclobutenes (BCB), or polyimide.

In some embodiments, the spacer material 122a is made of an extreme low-k (ELK) dielectric material with a dielectric constant (k) less than about 2.5. In some embodiments, the ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$).

The spacer material 122a may be formed by a deposition process, which may include a chemical vapor deposition (CVD) process, a high-density plasma chemical vapor deposition (HDPCVD) process, a spin-on process, or another applicable process. Moreover, reduced openings 121' are obtained since portions of the spacer material 122a is formed to fill into the openings 121.

Next, a portion of the spacer material 122a over the second portions 110b of the fin structures 110 and a portion of the spacer material 122a over the polysilicon layer 120 are removed by performing an etching process, as shown in FIGS. 1G, 2C-1 and 2C-2 in accordance with some embodiments. In some embodiments, the portions of the spacer material 122a covering the top surfaces and the sidewalls of the second portions 110b are removed, and a top portion of each of the second portions 110b are also removed, so that an etched spacer material 122a' and etched second portions 110b' are formed. As a result, the portion of the spacer material 122a over sidewalls of the polysilicon layer 120 (i.e. the etched spacer material 122a') remains after the etching process.

Moreover, in some embodiments, a portion of the isolation structures 114 in direct contact with the spacer material 122a is removed during the etching process for forming the etched spacer material 122a', and an etched isolation structure 114' is formed. As a result, openings 123 above the etched second portions 110b' and the etched isolation structure 114' are obtained, and the reduced openings 121' are above the openings 123, in accordance with some embodiments. In some embodiments, the methods for forming the etched spacer material 122a', the etched second portions 110b' and the etched isolation structure 114' include a dry etching process.

After the openings 123 below the reduced openings 121' are formed, dummy gate structures 124 are formed in the openings 123 and the reduced openings 121', as shown in FIGS. 1H, 2D-1 and 2D-2 in accordance with some embodiments. In some embodiments, the dummy gate structures 124 are formed over the etched second portions 110b' and extend over the etched isolation structure 114'.

More specifically, the methods for forming the dummy gate structures 124 may include filling a dielectric material (not shown) into the reduced openings 121' and the openings 123, and the dielectric material extends over top surfaces of the etched spacer material 122a'. The dielectric material may be formed by a deposition process, such as a chemical vapor deposition (CVD) process, a high-density plasma chemical vapor deposition (HDPCVD) process, a spin-on process, or another applicable process.

Then, the methods for forming the dummy gate structures 124 may further include performing a planarizing process to expose the top surfaces of the polysilicon layer 120. In some embodiments, the top surfaces of the polysilicon layer 120 are exposed by performing a grinding process, a chemical mechanical polishing (CMP) process, an etching process, another applicable process, or a combination thereof. After the planarizing process is performed, the spacers 122a" and the dummy gate structures 124 are obtained, and the spacers 122a" are formed between the dummy gate structures 124 and the polysilicon layer 120.

In some embodiments, the dummy gate structures 124 are made of a dielectric material, for example, a nitride-containing material such as SiN, a carbon-containing material such as SiCN or SiOCN, a combination thereof, or another applicable dielectric material. It should be noted that, in some embodiments, bottom surfaces of the spacers 122a" and bottom surfaces of the polysilicon layer 120 are higher than bottom surfaces of the dummy gate structures 124.

Then, the polysilicon layer 120 is removed, as shown in FIGS. 1I, 2E-1 and 2E-2 in accordance with some embodiments. In some embodiments, top surfaces 110T and sidewalls 110S of the first portions 110a are exposed after the polysilicon layer 120 is removed, and openings 125 are formed over the first portions 110a of the fin structures 110.

In some embodiments, the polysilicon layer 120 is removed by an etching process, which includes a dry etching, a wet etching, or a combination thereof. It should be noted that, the etching electivity of the polysilicon layer 120 is higher than the etching selectivity of the dummy gate structures 124 during the etching process. More specifically, the polysilicon layer 120 is removed by the etching process while the first portions 110a of the fin structures 110 are substantially not removed.

It should be noted that the position of the line II'-II', which FIG. 2E-2 is taken along, is different from the position of the line II-II, which FIGS. 2A-2, 2B-2, 2C-2 and 2D-2 are taken along. Therefore, FIG. 2E-2 shows the first portions 110a of the fin structures 110 rather than the second portions 110b of the fin structures 110.

After the removal of the polysilicon layer 120, source/drain (S/D) structures 130 are formed covering the top surfaces 110T and the sidewalls 110S of the first portions 110a of the fin structures 110, and reduced openings 125' are obtained, as shown in FIGS. 1J, 2F-1 and 2F-2 in accordance with some embodiments.

In some embodiments, a recessing process is not performed on the first portions 110a of the fin structures 110 between the formation of the S/D structures 130 and the removal of the polysilicon layer 120. In some embodiments, a strained material is grown over the top surfaces 110T and the sidewalls 110S of the first portions 110a by an epitaxial (epi) process to form the S/D structures 130. In addition, the lattice constant of the strained material may be different from the lattice constant of the substrate 102.

In some embodiments, the S/D structures 130 include Ge, SiGe, InAs, InGaAs, InSb, GaAs, GaSb, InAlP, InP, or the like. The S/D structures 130 may be referred to epitaxial S/D structures. In addition, a distance $D_1$ between the topmost surface of the S/D structures 130 and the bottommost surface of the dummy gate structures 124 is in a range from about 5 nm to about 15 nm, as shown in FIG. 2F-1 in accordance with some embodiments.

Moreover, each of the S/D structures 130 may have an inner surface 130S$_1$ surrounding the top surfaces 110T and the sidewalls 110S of the first portions 110a, and each of the S/D structures 130 may have an outer surface 130S$_2$ surrounding the inner surface 130S$_1$. In some embodiments, the outer surfaces 130S$_2$ are rounded. In some embodiments, the inner surface 130S$_2$ is in direct contact with the first portions 110a.

In addition, each of the S/D structures 130 may be formed as a cladding of each of the first portions 110a of the fin structures 110. It should be noted that, the channel height may be lowered while the positions of the S/D structures 130 is raised, so that the parasitic capacitance between the S/D structures 130 and the dummy gate structures 124 may be reduced.

In addition, there is a distance D$_2$ between the outer surfaces 130S$_2$ of the S/D structures 130 and the sidewalls 110S of the first portions 110a along a direction parallel to the top surfaces 110T, and there is a distance D$_3$ between the outer surfaces 130S$_2$ of the S/D structures 130 and the top surfaces 110T of the first portions 110a along a direction parallel to the sidewalls 110S, as shown in FIG. 2F-2 in accordance with some embodiments. In some embodiments, the distance D$_2$ is greater than or the same as the distance D$_3$. In some embodiments, a ratio (D$_3$/D$_2$) of the distance D$_3$ to the distance D$_2$ is in a range from about 0.5 to about 1.

In some embodiments, since the first portions 110a of the fin structures 110 are not recessed before forming the S/D structures 130 and after removing the polysilicon layer 120, the fin top loss problem can be mitigated or eliminated, and the stress of the fin structures 110 will not be lost. As a result, the gain of the FinFET device structure formed in the subsequent processes can be improved. Moreover, since the fin structures 110 are not recessed and the S/D structures 130 are formed as a cladding of the fin structures 110, the S/D structures 130 can be prevented from being merged with each other, even when the pitches between the fin structures 110 are small, in accordance with some embodiments.

After the S/D structures 130 are formed, an inter-layer dielectric (ILD) structure 132 is formed to cover the S/D structures 130, as shown in FIGS. 1K, 2G-1 and 2G-2 in accordance with some embodiments. In some embodiments, the ILD structure 132 includes multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of the low-k dielectric materials include, but are not limited to, fluorinated silica glass (FSG), carbon doped silicon oxide, amorphous fluorinated carbon, parylene, bis-benzocyclobutenes (BCB), or polyimide.

In addition, the method for forming the ILD structure 132 may include forming an ILD material (not shown), the ILD material may be formed filling the reduced openings 125' and covering the top surfaces of the spacers 122a" and the top surfaces of the dummy gate structures 124. The ILD material may be formed by chemical vapor deposition (CVD), physical vapor deposition, (PVD), atomic layer deposition (ALD), spin-on coating, or another applicable process.

Afterwards, a planarizing process is performed on the ILD material until the top surfaces of the dummy gate structures 124 are exposed. After the planarizing process, the top surfaces of the dummy gate structures 120 and the top surfaces of the spacers 122a" may be substantially level with the ILD structure 132. In some embodiments, the planarizing process includes a grinding process, a chemical mechanical polishing (CMP) process, an etching process, another applicable process, or a combination thereof. In addition, a contact etch stop layer (CESL) may be selectively formed between the S/D structures 130 and the ILD structure 132.

Figure 2H:
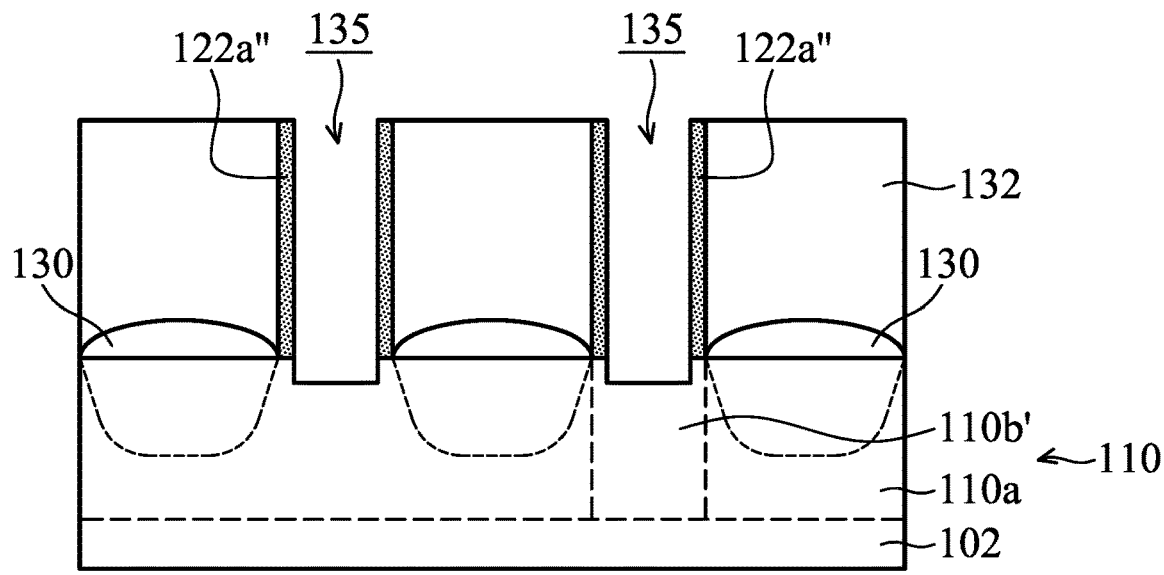

Then, after the ILD structure 132 is formed, the dummy gate structures 124 are removed, and the etched second portions 110b' of the fin structures 110 are exposed by openings 135, as shown in FIGS. 1L and 2H in accordance with some embodiments. In some embodiments, the dummy gate structures 124 are removed by an etching process, such as a wet etching process.

Figure 2I:
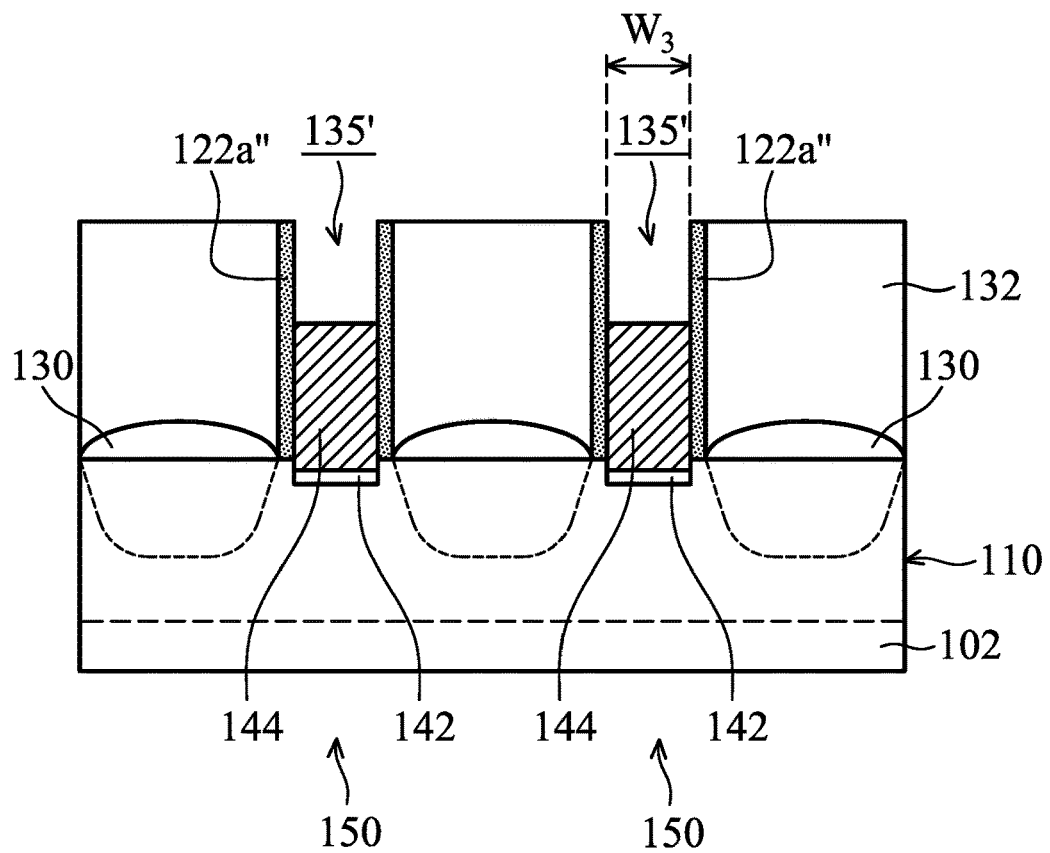

After the etched second portions 110b' of the fin structures 110 are exposed, gate structures 150 are formed in the openings 135, as shown in FIGS. 1M and 2I in accordance with some embodiments. Each of the gate structures 150 includes a gate dielectric layer 142 and a gate electrode layer 144 formed over the gate dielectric layer 142. After the gate structures 150 are formed, reduced openings 135' may be obtained above the gate structures 150.

Each of the gate dielectric layers 142 may be a single layer or multiple layers. In some embodiments, the gate dielectric layers 142 are made of silicon oxide, silicon nitride, silicon oxynitride (SiON), dielectric material(s) with high dielectric constant (high-k), a combination thereof, or another dielectric material. In some embodiments, the gate dielectric layers 142 are deposited by a plasma enhanced chemical vapor deposition (PECVD) process, an atomic layer deposition (ALD) process, or a plasma enhanced atomic layer deposition (PE-ALD) process.

Moreover, the gate electrode layers 144 are made of a conductive material such as aluminum (Al), copper (Cu), tungsten (W), titanium (Ti), tantalum (Ta), or another applicable material, in accordance with some embodiments. The gate electrode layers 142 may be formed by a deposition process and a subsequent etch-back process. The deposition process may be a chemical vapor deposition (CVD) process, a physical vapor deposition (PVD) process, an atomic layer deposition (ALD) process, a high density plasma CVD (HDPCVD) process, a metal organic CVD (MOCVD) process, or a plasma enhanced CVD (PECVD) process.

In addition, work function layers (not shown) may be formed between each of the gate dielectric layers 142 and each of the gate electrode layers 144. The work function layers may be made of metal materials, and the metal materials may include N-work-function metal or P-work-function metal. The N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal may include titanium nitride (TiN), tungsten nitride (WN), tantalum nitride (TaN), ruthenium (Ru) or a combination thereof.

Each of the gate structures 150 has a width W$_3$, as shown in FIG. 2I in accordance with some embodiments. In some embodiments, the width W$_3$ is smaller than the width W$_1$ of each of the segments of the polysilicon layer 120 as shown in FIG. 2A-1. In some embodiments, a ratio (W$_1$/W$_3$) of the width W$_1$ to the width W$_3$ is in a range from about 1.3 to about 2.

Figure 2J:
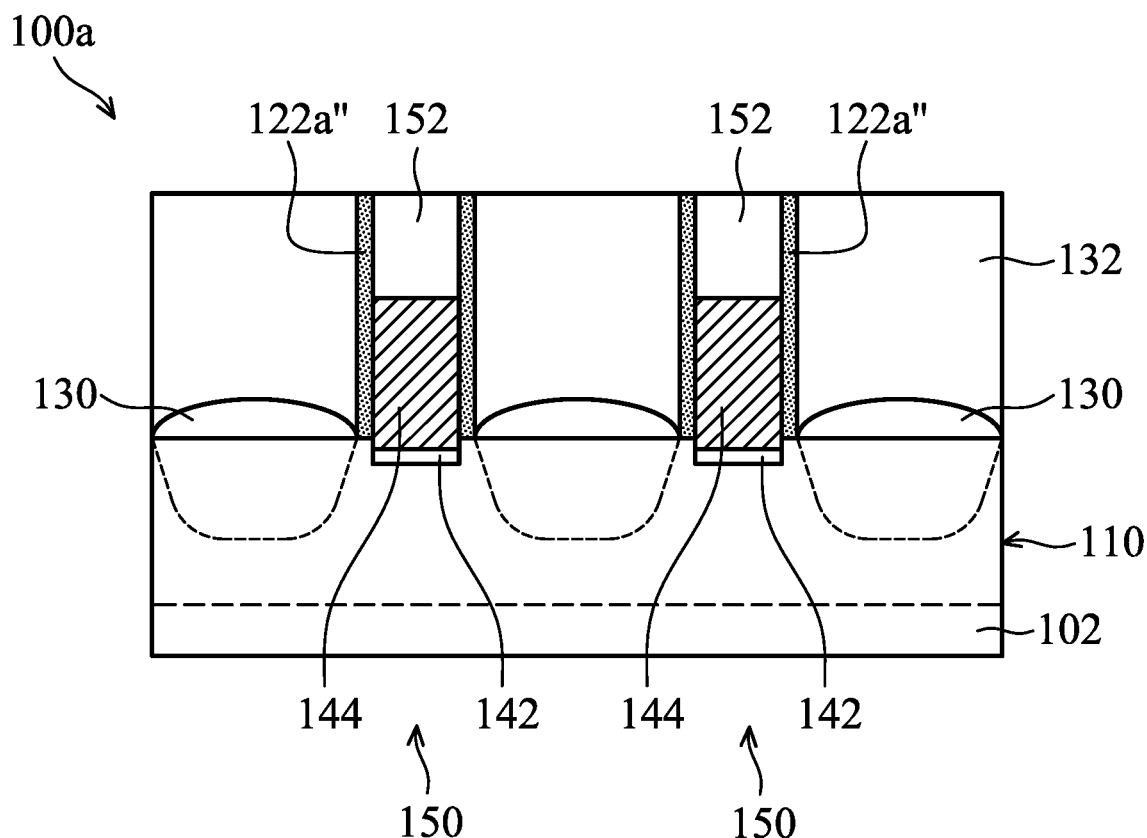

Afterwards, a mask layer 152 is formed over the gate structures 150, as shown in FIGS. 1N and 2J in accordance with some embodiments. The mask layer 152 may be used as a mask for performing a self-aligned etching process to form contacts electrically connected to the S/D structures 130 in the subsequent processes. The reduced openings 135' are filled by the mask layer 152. After the mask layer 152 is formed, the FinFET device structure 100a is obtained.

In some embodiments, the mask layer 152 is made of silicon oxide, silicon nitride, silicon carbonitride (SiCN), silicon oxide carbonitride (SiOCN), SiLK, or a combination thereof. It should be noted that the material of the mask layer 152 is different from the material of the ILD structure 132, in accordance with some embodiments. The mask layer 152 may be formed by a procedure including deposition and planarizing process. The deposition process may be a chemical vapor deposition (CVD) process, an atomic layer deposition (ALD) process, or another applicable process. The planarizing process may be a grinding process, a chemical mechanical polishing (CMP) process, an etching process, another applicable process, or a combination thereof.

In some embodiments, the width $W_1$ of each of the segments of the polysilicon layer 120 is greater than the width $W_3$ of each of the gate structures 150, which is substantially the same as the width of each of the dummy gate structures 124. Since the width $W_1$ of the polysilicon layer 120 is large, the polysilicon layer 120 is less likely to collapse. In addition, although the width of each of the dummy gate structures 124 is small, the dummy gate structures 124 are not likely to collapse since they are made of dielectric materials rather than polysilicon.

FIGS. 3A to 3E are perspective representations of various stages of forming a modified FinFET device structure 100b, in accordance with some embodiments of the disclosure. FIGS. 4A-1, 4A-2 and 4B to 4E are cross-sectional representations of various stages of forming the modified FinFET device structure 100b shown in FIGS. 3A to 3E, in accordance with some embodiments of the disclosure.

Figure 3A:
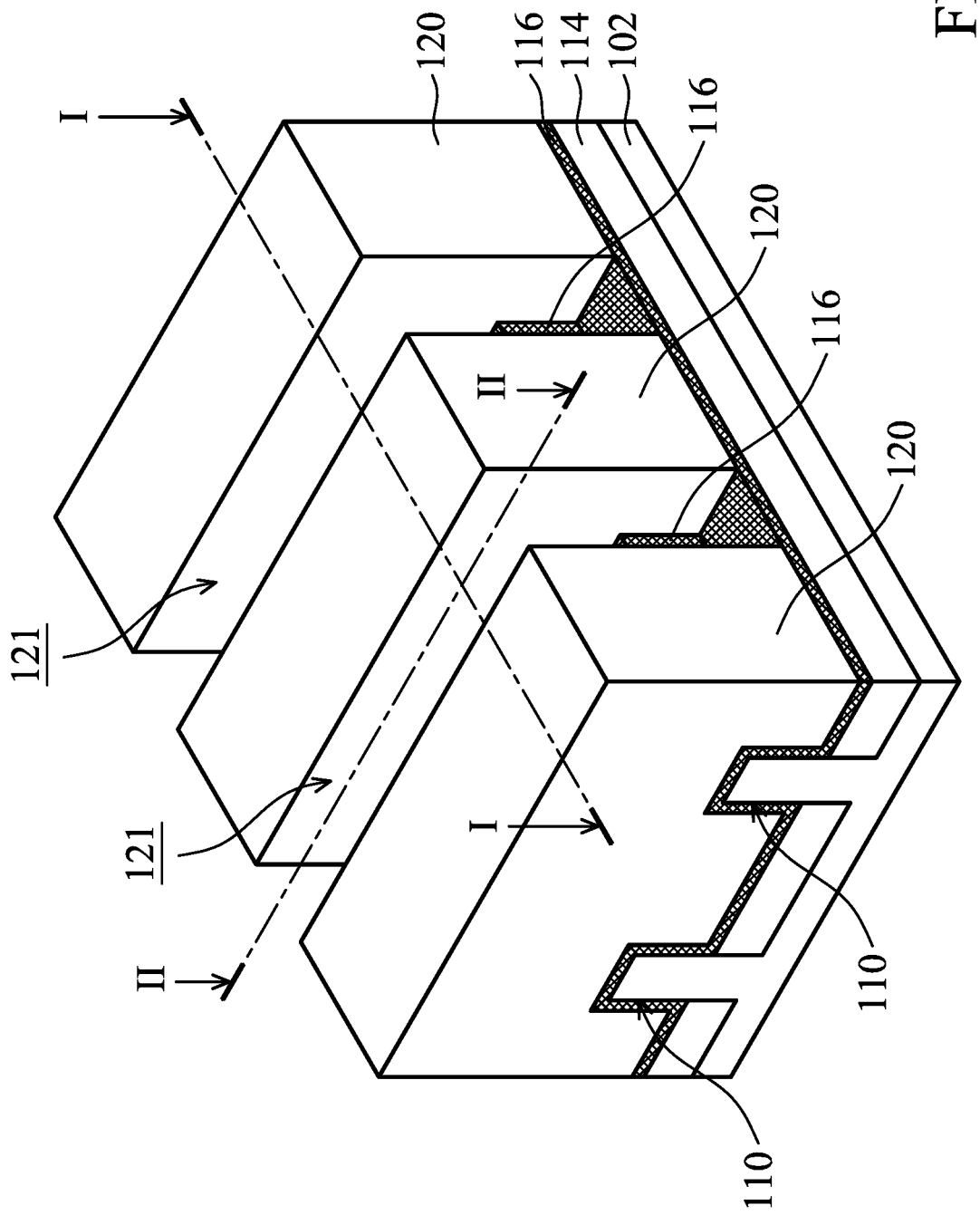
FIGS. 3A to 3E are perspective representations of various stages of forming a modified FinFET device structure, in accordance with some embodiments of the disclosure.
Figure 3B:
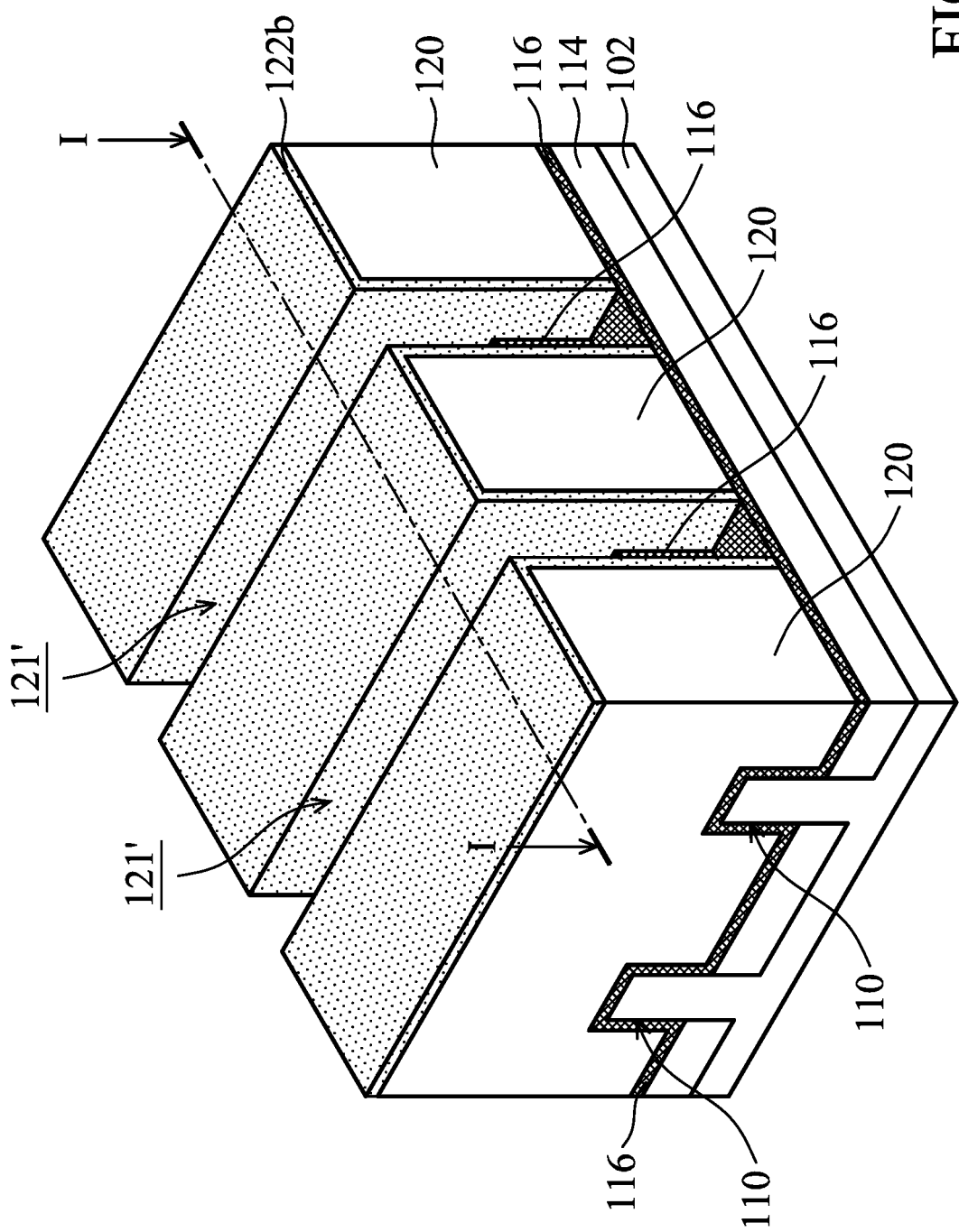
Figure 3C:
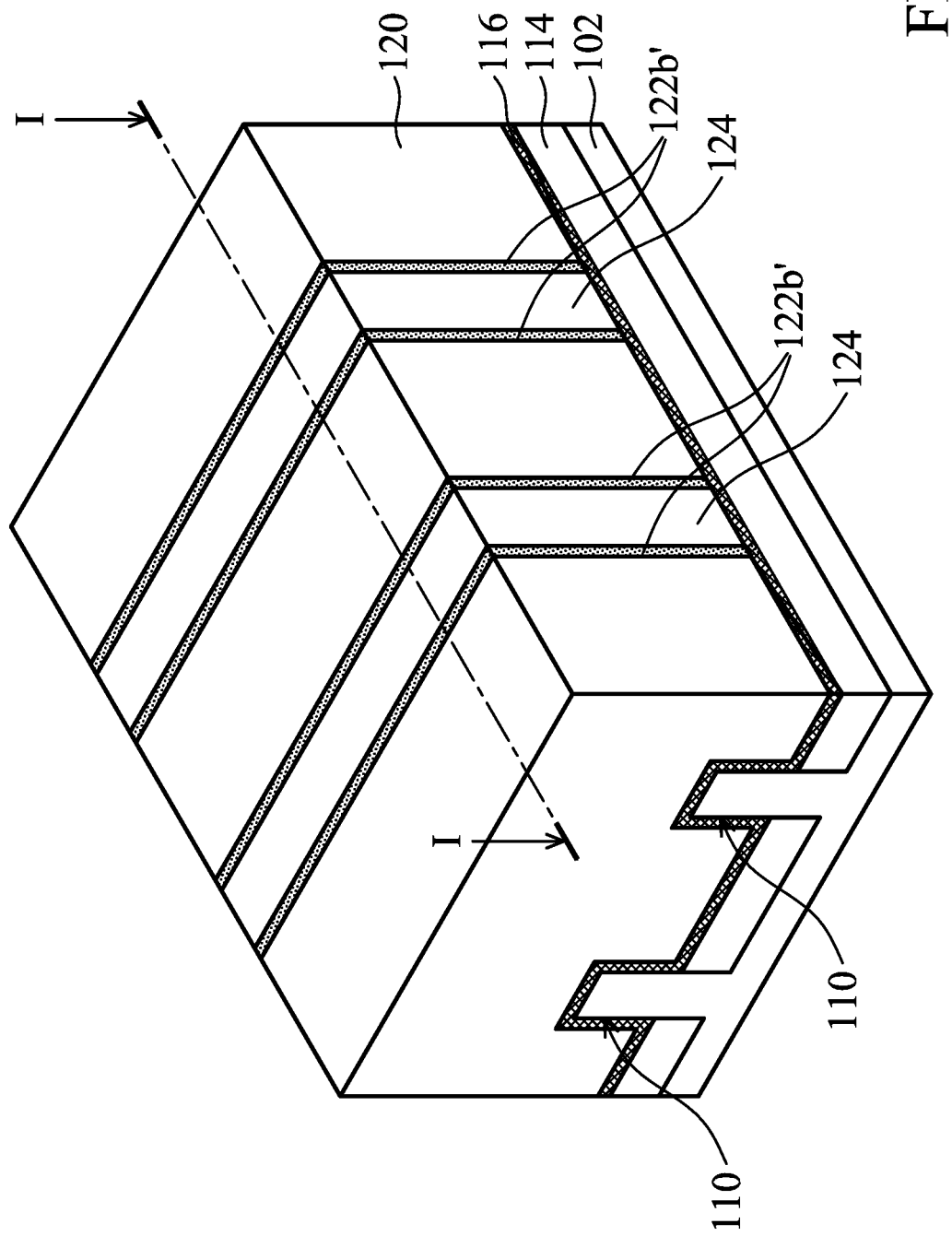
Figure 3D:
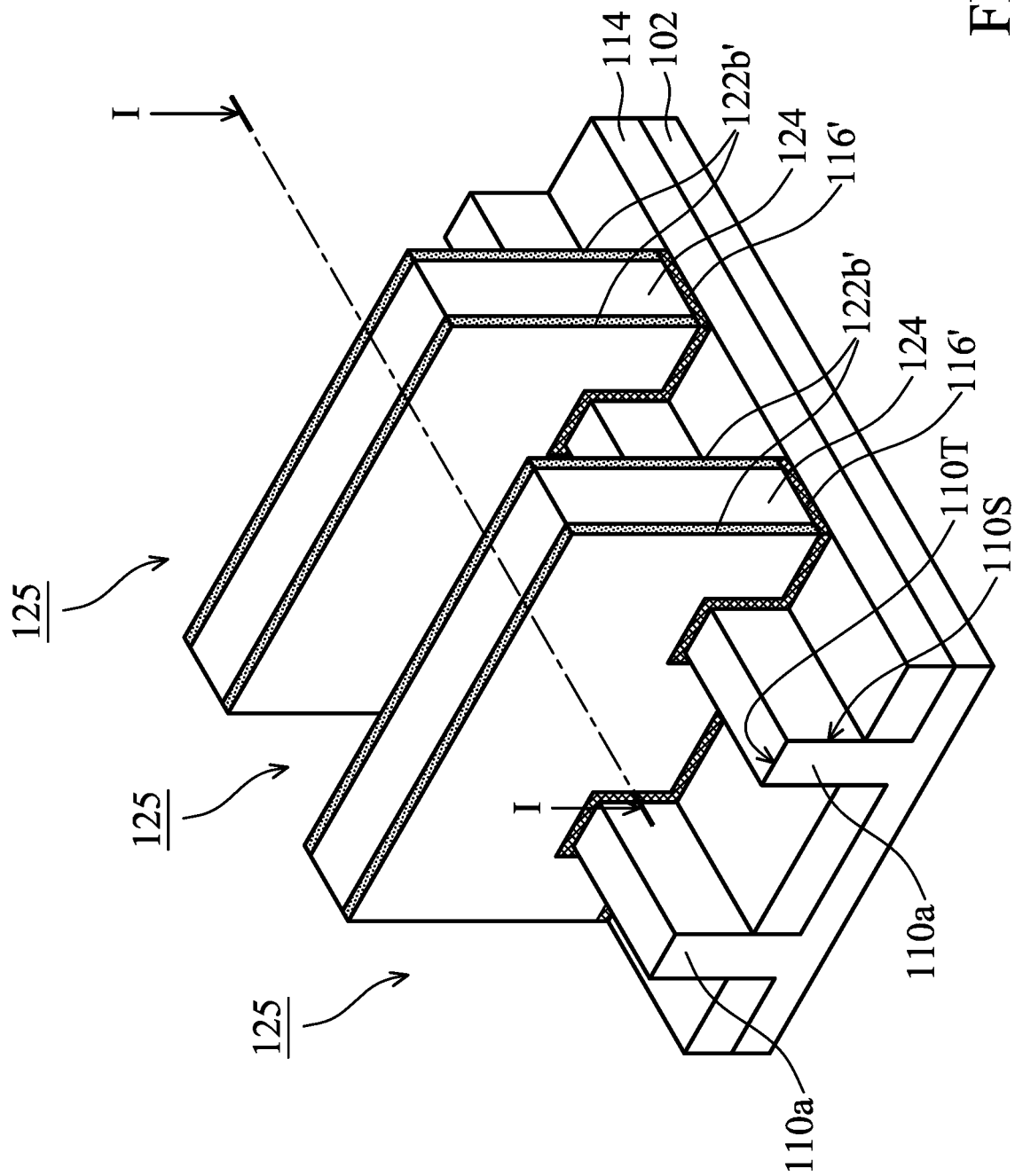
Figure 3E:
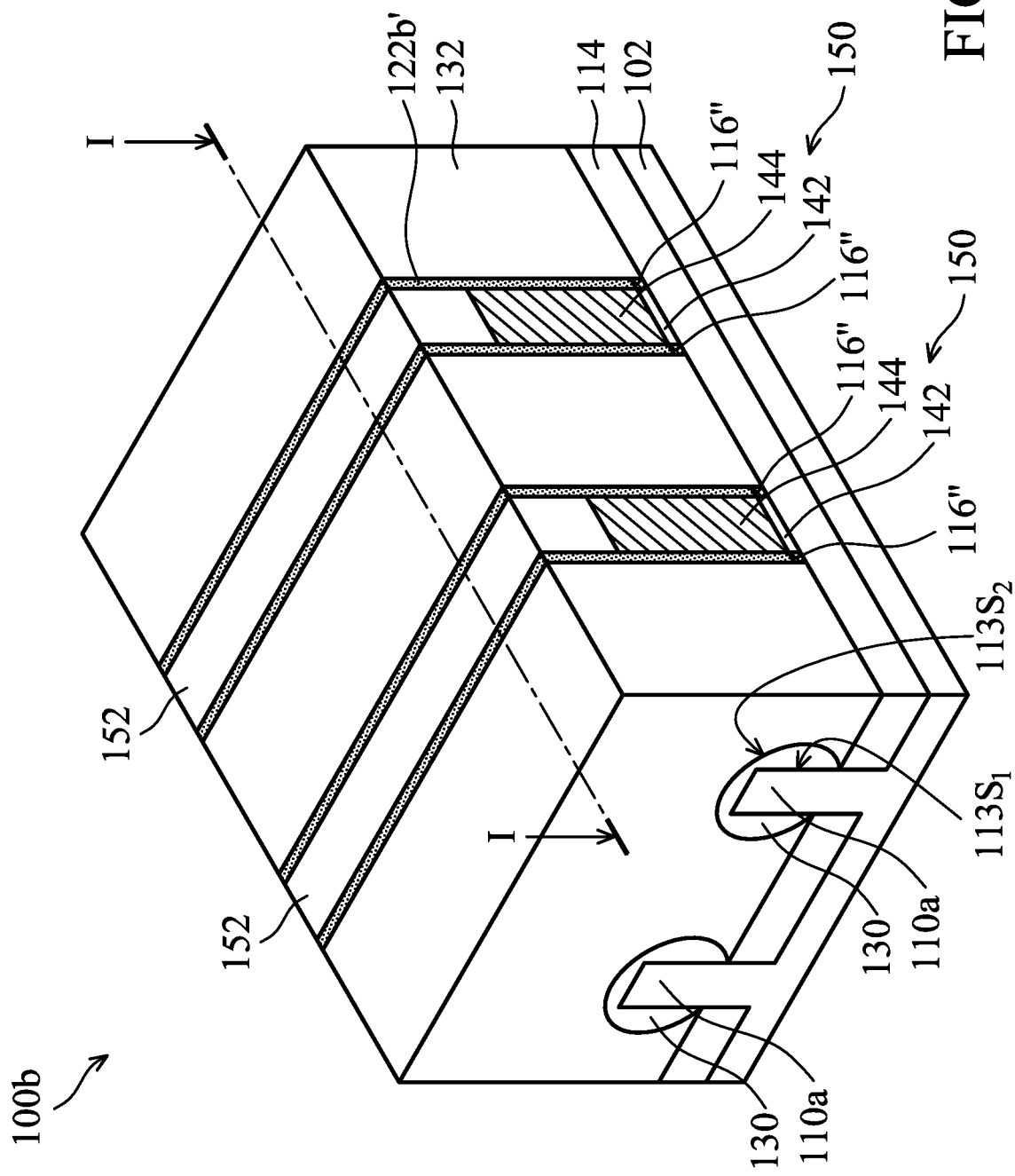
Figures 1, 4A:
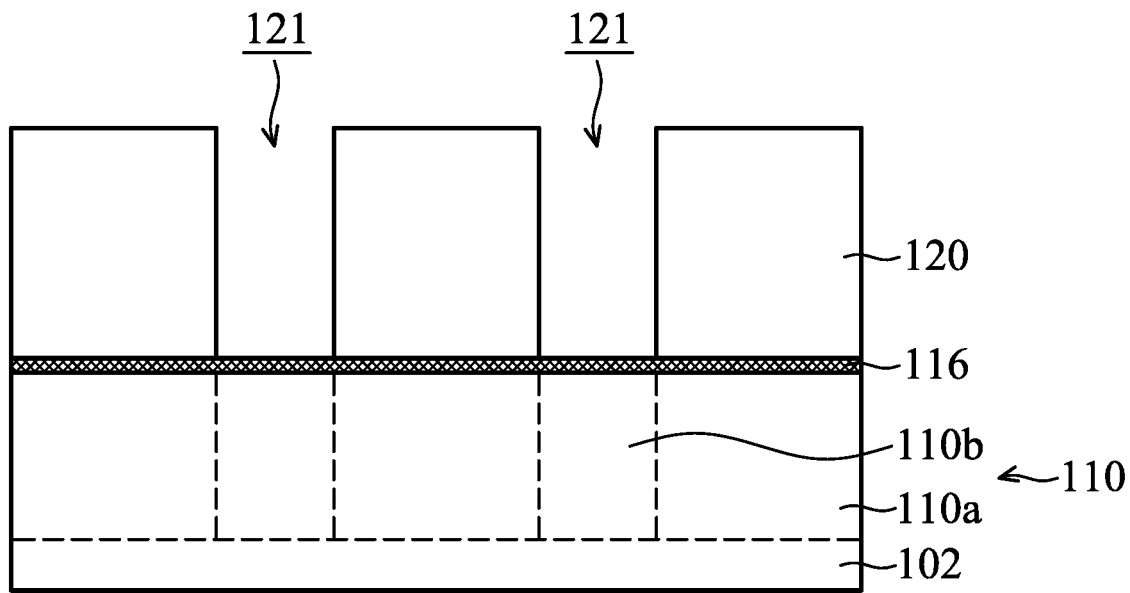
Figures 2, 4A:
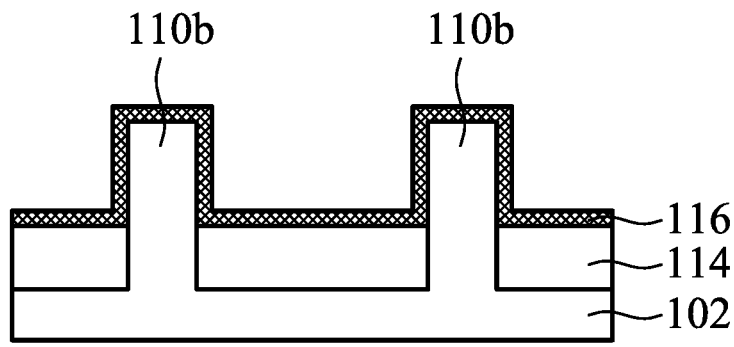

FIGS. 4A-1 and 4B to 4E are cross-sectional representations taken along line I-I of FIGS. 3A to 3E. FIG. 4A-2 is a cross-sectional representation taken along line II-II of FIG. 3A. It should be noted that the elements in FIGS. 3A to 3E, 4A-1, 4A-2 and 4B to 4E, which are named and labeled identically to those in FIGS. 1A-1N, 2A-1 to 2G-1, 2A-2 to 2G-2, and 2H to 2J, also have the same or similar materials and structures. Therefore, detailed descriptions are not repeated herein.

The structure shown in FIG. 3A is similar to the structure shown in FIG. 1E. The difference between FIG. 3A and FIG. 1E is that a dielectric material 116 is formed before the formation of the polysilicon layer 120. More specifically, the dielectric material 116 is formed to conformally cover the fin structures 110 and the isolation structure 114 after the isolation structures 114 are formed, and the polysilicon layer 120 is formed over the dielectric material layer 116, as shown in FIGS. 3A, 4A-1 and 4A-2 in accordance with some embodiments.

In some embodiments, the dielectric material 116 is made of low-k dielectric materials. In some embodiments, the low-k dielectric materials have a dielectric constant (k value) less than about 4. Examples of low-k dielectric materials include, but are not limited to, silicon oxide, silicon nitride, silicon carbonitride (SiCN), silicon oxide carbonitride (SiOCN), fluorinated silica glass (FSG), carbon doped silicon oxide, amorphous fluorinated carbon, parylene, bis-benzocyclobutenes (BCB), or polyimide. The dielectric material 116 may be formed by a deposition process, which may include a chemical vapor deposition (CVD) process, a high-density plasma chemical vapor deposition (HDPCVD) process, a spin-on process, or another applicable process.

Similar to the structure shown in FIGS. 1E, 2A-1 and 2A-2, the first portions 110a of the fin structures 110 and the portions of the dielectric material 116 directly over the first portions 110a are covered by the polysilicon layer 120, while the portions of the dielectric material 116 directly over the second portions 110b of the fin structures 110 are exposed by the openings 121 in the polysilicon layer 120, as shown in FIGS. 4A-1 and 4A-2 in accordance with some embodiments.

Figure 4B:
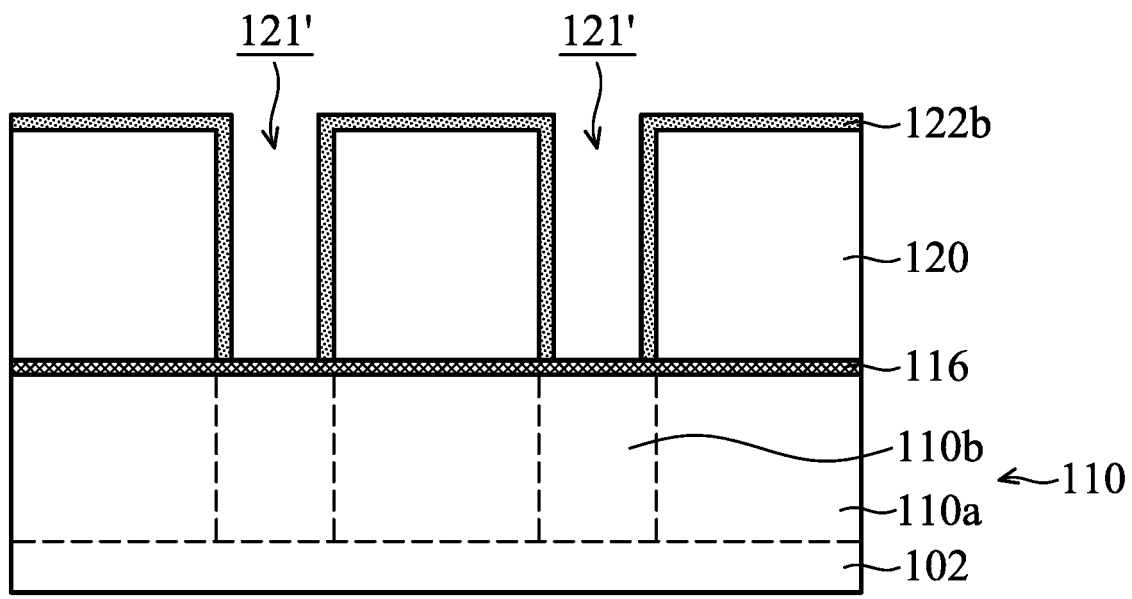

Next, a spacer material 122b is formed to cover the top surfaces and the sidewalls of each segment of the polysilicon layer 120, as shown in FIGS. 3B and 4B in accordance with some embodiments. The difference between the spacer material 122b and the spacer material 122a (as shown in FIG. 1G) is that the top surface and the sidewalls of the second portions 110b of the fin structures 110 are not covered by the spacer material 122b. In addition, some materials used to form the spacer material 122b are similar to, or the same as, those used to form the spacer material 122a and are not repeated herein.

In some embodiments, the spacer material 122b is formed by forming an organic layer (not shown) over the polysilicon layer 120 and the second portions 110b so that the spacer material 122b can easily nucleate over the top surfaces and the sidewalls of the polysilicon layer 120 rather than nucleate over the dielectric material 116 exposed by the polysilicon layer 120. Moreover, the reduced openings 121' are obtained after a portion of the spacer material 122b are formed in the openings 121 between the segments of the polysilicon layer 120.

Figure 4C:
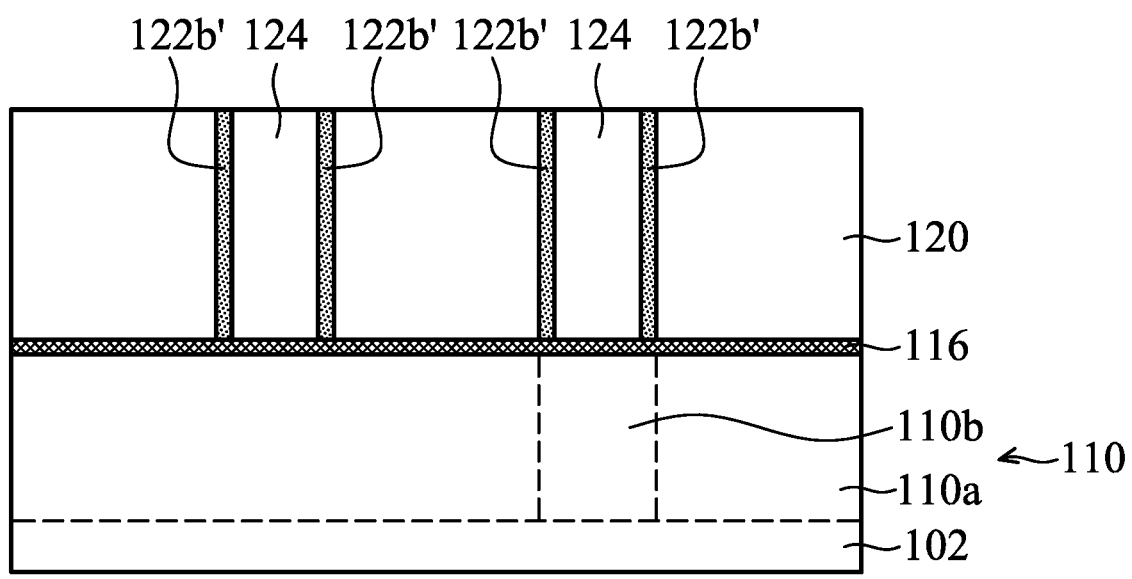

Afterwards, the reduced openings 121' are filled by the dummy gate structures 124, as shown in FIGS. 3C and 4C in accordance with some embodiments. Moreover, the top surfaces of the polysilicon layer 120 are exposed by performing a planarizing process, such as a grinding process, a chemical mechanical polishing (CMP) process, an etching process, another applicable process, or a combination thereof. After the planarizing process, the spacers 122b' and the dummy gate structures 124 are obtained, and the spacers 122b' are formed between the dummy gate structures 124 and the polysilicon layer 120. It should be noted that, the dummy gate structures 124 and the spacers 122b' are separated from the fin structures 110 by a portion of the dielectric material 116, as shown in FIG. 4C in accordance with some embodiments.

Figure 4D:
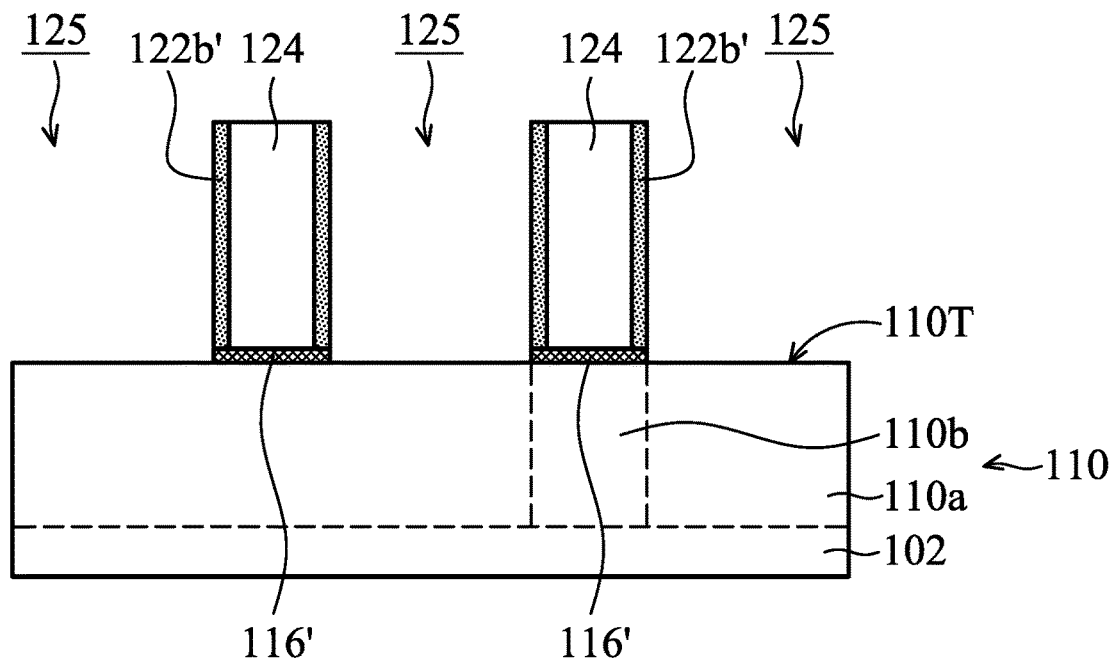

After the dummy gate structures 124 are formed, the polysilicon layer 120 and the portions of the dielectric material 116 covered by the polysilicon layer 120 are removed, as shown in FIGS. 3D and 4D in accordance with some embodiments. In some embodiments, the top surfaces 110T and the sidewalls 110S of the first portions 110a are exposed, and the openings 125 are formed over the first portions 110a of the fin structures 110. In addition, the remaining portion of the dielectric material 116 may be referred to as a dielectric layer 116', and sidewalls of the dielectric layer 116' may be exposed after the removal of the polysilicon layer 120.

Figure 4E:
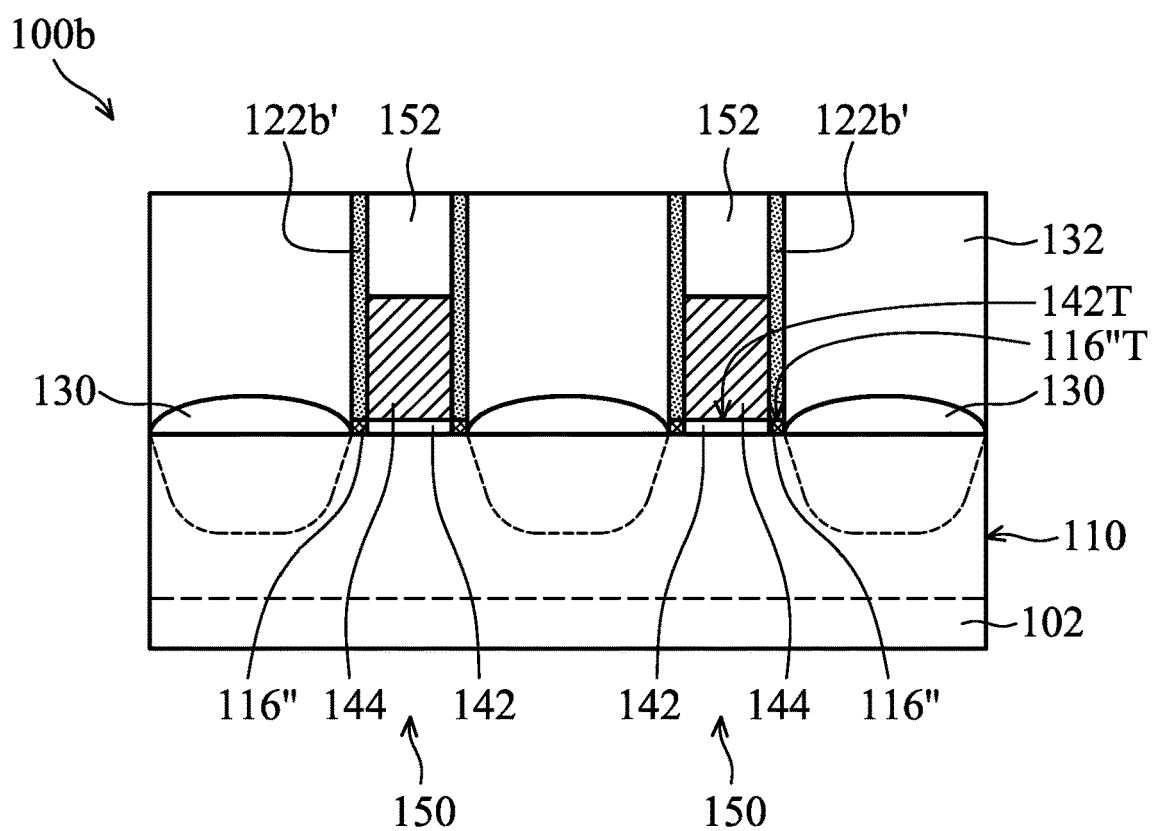

Afterwards, the processes similar to, or the same as the processes shown in FIGS. 1L to 1N are performed in order to obtain the FinFET device structure 100b, as shown in FIGS. 3E and 4E in accordance with some embodiments. In some embodiments, the portions of the dielectric layer 116' directly below the dummy gate structures 124 are removed after the removal of the dummy gate structures 124, and the remaining portions of the dielectric layer 116' may be referred to as dielectric portions 116". It should be noted that, the gate dielectric layers 142 are formed between the dielectric portions 116" in accordance with some embodiments.

More specifically, top surfaces 116"T of the dielectric portions 116" may not be level with top surfaces 142T of the gate dielectric layers 142. It should be noted that, the dielectric constant of the gate dielectric layers 142 may be higher than the dielectric constant of the dielectric portions 116". In some embodiments, the gate dielectric layers 142 are made of high-k dielectric materials, and the dielectric portions 116" are made of low-k dielectric materials.

In the embodiments of the FinFET device structures 100a and 100b, in order to prevent the fin top loss problem, a recessing process is not performed on the first portions 110a the fin structures 110, which the S/D structures 130 are designed to be formed over, and the gain of the FinFET device structures 100a and 100b can be improved. Moreover, since the fin structures 110 are not recessed and the S/D structures 130 are formed as a cladding of the fin structures 110, the S/D structures 130 will not merge together, even when the pitches between the fin structures 110 are small.

Furthermore, the width $W_1$ of each of the segments of the polysilicon layer 120 is greater than the width $W_3$ of each of the gate structures 150, which is substantially the same as the width of each of the dummy gate structures 124, in accordance with some embodiments of the FinFET device structures 100a and 100b. Since the width $W_1$ is large, the polysilicon layer 120 is less likely to collapse. In addition, although the width of each of the dummy gate structures 124 is small, the dummy gate structures 124 are not likely to collapse since they are made of dielectric materials rather than polysilicon.

Embodiments of a FinFET device structure and method for forming the same are provided. The FinFET device structure may include an epitaxial S/D structure formed over a fin structure, and a top surface and a sidewall of the fin structure may be surrounded by the epitaxial S/D structure. Prior to the growing of the epitaxial S/D structure, the portion of the fin structure designed to be covered by the epitaxial S/D structure may not be recessed. Therefore, the gain of the FinFET device structure may be improved, and the process window for growing the epitaxial S/D structure may be enlarged.

In some embodiments, a FinFET device structure is provided. The FinFET device structure includes a fin structure formed over a substrate, and a gate structure formed over the fin structure. The FinFET device structure also includes an epitaxial S/D structure formed over the fin structure. A top surface and a sidewall of the fin structure are surrounded by the epitaxial S/D structure. A first distance between an outer surface of the epitaxial S/D structure and the sidewall of the fin structure is no less than a second distance between the outer surface of the epitaxial S/D structure and the top surface of the fin structure.

In some embodiments, an interface between the gate structure and the fin structure is level with or lower than an interface between the epitaxial S/D structure and the fin structure. In some embodiments, the epitaxial S/D structure has an inner surface in contact with the top surface and the sidewall of the fin structure, the inner surface is surrounded by the outer surface of the epitaxial S/D structure, and the outer surface is rounded. In some embodiments, the FinFET device structure further includes: an isolation structure formed over the substrate. An interface between the epitaxial S/D structure and the fin structure is higher than a top surface of the isolation structure. In some embodiments, a ratio of the second distance to the first distance is in a range from about 0.5 to about 1. In some embodiments, the FinFET device structure further includes: spacers formed between the gate structure and the epitaxial S/D structure. A bottom surface of the spacers is higher than a bottom surface of the gate structure. In some embodiments, the gate structure further includes a gate dielectric layer and a gate electrode layer formed over the gate dielectric layer, and a top surface of the gate dielectric layer is lower than the bottom surface of the spacers. In some embodiments, the FinFET device structure further includes: a mask layer formed over the gate structure. A top surface of the mask layer is substantially level with a top surface of the mask layer. In some embodiments, the FinFET device structure further includes: spacers formed between the gate structure and the epitaxial S/D structure and a dielectric portion covered by the spacers. The gate structure further includes a gate dielectric layer and a gate electrode layer formed over the gate dielectric layer, and a dielectric constant of the gate dielectric layer is higher than a dielectric constant of the dielectric portion. In some embodiments, the FinFET device structure further includes: an inter-layer dielectric structure formed to cover the outer surface of the epitaxial S/D structure.

In some embodiments, a FinFET device structure is provided. The FinFET device structure includes a fin structure formed over a substrate and an isolation structure formed over the substrate. A protruding portion of the fin structure is exposed from the isolation structure. The FinFET device structure further includes a gate structure formed over the fin structure and an epitaxial source/drain (S/D) structure covering the protruding portion of the fin structure. Te epitaxial S/D structure has an inner surface and an outer surface, the inner surface is conformal to the protruding portion of the fin structure, and the outer surface is rounded.

In some embodiments, a first distance between an outer surface of the epitaxial S/D structure and a sidewall of the fin structure is no less than a second distance between the outer surface of the epitaxial S/D structure and a top surface of the fin structure. In some embodiments, the FinFET device structure further includes: spacers formed between the gate structure and the epitaxial S/D structure. A bottom surface of the spacers is higher than a bottom surface of the gate structure. In some embodiments, the gate structure further includes a gate dielectric layer and a gate electrode layer formed over the gate dielectric layer, and the gate dielectric layer is separated from the spacers via the gate electrode layer. In some embodiments, the FinFET device structure further includes: spacers formed between the gate structure and the epitaxial S/D structure and a dielectric portion covered by the spacers. The gate structure further includes a gate dielectric layer and a gate electrode layer formed over the gate dielectric layer, and a dielectric constant of the gate dielectric layer is higher than a dielectric constant of the dielectric portion.

In some embodiments, a FinFET device structure is provided. The FinFET device structure includes a fin structure formed over a substrate, and a gate structure formed over the fin structure. The FinFET device structure further includes an epitaxial source/drain (S/D) structure formed over the fin structure. A top surface and a sidewall of the fin structure are surrounded by the epitaxial S/D structure, and a bottom surface of the gate structure is lower than the top surface of the fin structure. In some embodiments, the FinFET device structure further includes: an isolation structure formed over the substrate. An interface between the epitaxial S/D structure and the fin structure is higher than a top surface of the isolation structure. In some embodiments, the FinFET device structure further includes: spacers formed between the gate structure and the epitaxial S/D structure. A bottom surface of the spacers is higher than a bottom surface of the gate structure. In some embodiments, the gate structure further includes a gate dielectric layer and a gate electrode layer formed over the gate dielectric layer, and a bottom surface of the gate electrode layer is lower than the bottom surface of the spacers. In some embodiments, the FinFET device structure further includes: spacers formed between the gate structure and the epitaxial S/D structure and a dielectric portion covered by the spacers. The gate structure further includes a gate dielectric layer and a gate electrode layer formed over the gate dielectric layer, and a dielectric constant of the gate dielectric layer is higher than a dielectric constant of the dielectric portion.

In some embodiments, a method for forming a FinFET device structure is provided. The method for forming a FinFET device structure includes forming a fin structure over a substrate, and forming polysilicon layer over a first portion of the fin structure. A second portion of the fin structure is exposed by the polysilicon layer. The method for forming a FinFET device structure also includes forming a dummy gate structure over the second portion of the fin structure, and removing the polysilicon layer to expose a top surface and a sidewall of the fin structure. The method for forming a FinFET device structure further includes epitaxially growing an S/D structure covering the top surface and the sidewall of the fin structure, and replacing the dummy gate structure with a gate structure.

In some embodiments, a method for forming a FinFET device structure is provided. The method for forming a FinFET device structure includes forming a fin structure over a substrate, and forming a polysilicon layer over a first portion of the fin structure. The method for forming a FinFET device structure also includes forming a dummy gate structure over a second portion of the fin structure, and removing the polysilicon layer to expose a top surface and a sidewall of the fin structure. The method for forming a FinFET device structure further includes epitaxially growing an S/D structure over the first portion of the fin structure. The S/D structure has an inner surface in contact with the top surface and the sidewall of the fin structure and an outer surface surrounding the inner surface. In addition, the method includes replacing the dummy gate structure with a gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET) device structure, comprising:
    a fin structure formed over a substrate;
    an isolation structure formed over the substrate;
    a gate structure formed over the fin structure; and
    an epitaxial source/drain (S/D) structure formed over the fin structure, wherein a top surface and a sidewall of the fin structure are surrounded by the epitaxial S/D structure,
    wherein a first distance between a rounded outer surface of the epitaxial S/D structure and the sidewall of the fin structure is greater than a second distance between the rounded outer surface of the epitaxial S/D structure and the top surface of the fin structure, and a width of the epitaxial S/D structure between the rounded outer surface of the epitaxial S/D structure and the sidewall of the fin structure gradually increases from an intersection of the rounded outer surface of the epitaxial S/D structure and a top surface of the isolation structure.

2. The fin field effect transistor (FinFET) device structure as claimed in claim 1, wherein an interface between the gate structure and the fin structure is level with or lower than an interface between the epitaxial S/D structure and the fin structure.

3. The fin field effect transistor (FinFET) device structure as claimed in claim 1, wherein the epitaxial S/D structure has an inner surface in contact with the top surface and the sidewall of the fin structure, the inner surface is surrounded by the rounded outer surface of the epitaxial S/D structure.

4. The fin field effect transistor (FinFET) device structure as claimed in claim 1,
    wherein an interface between the epitaxial S/D structure and the fin structure is higher than the top surface of the isolation structure.

5. The fin field effect transistor (FinFET) device structure as claimed in claim 1, wherein a ratio of the second distance to the first distance is in a range from about 0.5 to about 1.

6. The fin field effect transistor (FinFET) device structure as claimed in claim 1, further comprising:
    spacers formed between the gate structure and the epitaxial S/D structure, wherein a bottom surface of the spacers is higher than a bottom surface of the gate structure.

7. The fin field effect transistor (FinFET) device structure as claimed in claim 6, wherein the gate structure further comprises a gate dielectric layer and a gate electrode layer formed over the gate dielectric layer, and a top surface of the gate dielectric layer is lower than the bottom surface of the spacers.

8. The fin field effect transistor (FinFET) device structure as claimed in claim 6, further comprising:
    a mask layer formed over the gate structure, wherein a top surface of the mask layer is substantially level with a top surface of the mask layer.

9. The fin field effect transistor (FinFET) device structure as claimed in claim 1, further comprising:
    spacers formed between the gate structure and the epitaxial S/D structure; and
    a dielectric portion covered by the spacers, wherein the gate structure further comprises a gate dielectric layer and a gate electrode layer formed over the gate dielectric layer, and a dielectric constant of the gate dielectric layer is higher than a dielectric constant of the dielectric portion.

10. The fin field effect transistor (FinFET) device structure as claimed in claim 1, wherein an interface between the epitaxial S/D structures and a top surface of the fin structure is higher than an interface between a bottom surface of the gate structure and the top surface of the fin structure.

11. A fin field effect transistor (FinFET) device structure, comprising:
    a fin structure formed over a substrate;

an isolation structure formed over the substrate, wherein a protruding portion of the fin structure is exposed from the isolation structure;
a gate structure formed over the fin structure; and
an epitaxial source/drain (S/D) structure covering the protruding portion of the fin structure, wherein the epitaxial S/D structure has an inner surface and an outer surface, the inner surface is conformal to the protruding portion of the fin structure, and the outer surface is rounded,
wherein an interface between the epitaxial S/D structures and a top surface of the fin structure is higher than an interface between a bottom surface of the gate structure and the top surface of the fin structure.

12. The fin field effect transistor (FinFET) device structure as claimed in claim 11, wherein a first distance between an outer surface of the epitaxial S/D structure and a sidewall of the fin structure is no less than a second distance between the outer surface of the epitaxial S/D structure and a top surface of the fin structure.

13. The fin field effect transistor (FinFET) device structure as claimed in claim 11, further comprising:
spacers formed between the gate structure and the epitaxial S/D structure, wherein a bottom surface of the spacers is higher than a bottom surface of the gate structure.

14. The fin field effect transistor (FinFET) device structure as claimed in claim 13, wherein the gate structure further comprises a gate dielectric layer and a gate electrode layer formed over the gate dielectric layer, and the gate dielectric layer is separated from the spacers via the gate electrode layer.

15. The fin field effect transistor (FinFET) device structure as claimed in claim 11, further comprising:
spacers formed between the gate structure and the epitaxial S/D structure; and
a dielectric portion covered by the spacers, wherein the gate structure further comprises a gate dielectric layer and a gate electrode layer formed over the gate dielectric layer, and a dielectric constant of the gate dielectric layer is higher than a dielectric constant of the dielectric portion.

16. A fin field effect transistor (FinFET) device structure, comprising:
a fin structure formed over a substrate;
a gate structure formed over the fin structure, wherein the gate structure further comprises a gate dielectric layer and a gate electrode layer formed over the gate dielectric layer;
an epitaxial source/drain (S/D) structure formed over the fin structure, wherein a top surface and a sidewall of the fin structure are surrounded by the epitaxial S/D structure, and a bottom surface of the gate structure is lower than the top surface of the fin structure; and
spacers formed between the gate structure and the epitaxial S/D structure, wherein the gate dielectric layer is separated from the spacers via the gate electrode layer.

17. The fin field effect transistor (FinFET) device structure as claimed in claim 16, further comprising:
an isolation structure formed over the substrate, wherein an interface between the epitaxial S/D structure and the fin structure is higher than a top surface of the isolation structure.

18. The fin field effect transistor (FinFET) device structure as claimed in claim 16, wherein a bottom surface of the spacers is higher than a bottom surface of the gate structure.

19. The fin field effect transistor (FinFET) device structure as claimed in claim 16, wherein a bottom surface of the gate electrode layer is lower than the bottom surface of the spacers.

20. The fin field effect transistor (FinFET) device structure as claimed in claim 16, further comprising:
a dielectric portion covered by the spacers, wherein a dielectric constant of the gate dielectric layer is higher than a dielectric constant of the dielectric portion.

* * * * *